United States Patent
Park

(10) Patent No.: US 7,560,359 B2
(45) Date of Patent: Jul. 14, 2009

(54) METHODS OF FORMING ASYMMETRIC RECESSES AND GATE STRUCTURES THAT FILL SUCH RECESSES AND RELATED METHODS OF FORMING SEMICONDUCTOR DEVICES THAT INCLUDE SUCH RECESSES AND GATE STRUCTURES

(75) Inventor: Se-Keun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 263 days.

(21) Appl. No.: 11/440,183

(22) Filed: May 24, 2006

(65) Prior Publication Data

US 2006/0237817 A1    Oct. 26, 2006

Related U.S. Application Data

(63) Continuation-in-part of application No. 11/285,558, filed on Nov. 22, 2005.

(30) Foreign Application Priority Data

Jul. 28, 2005    (KR) ...................... 10-2005-0069061

(51) Int. Cl.
*H01L 21/76* (2006.01)
(52) U.S. Cl. .................. 438/426; 438/427; 257/301; 257/330; 257/E21.41
(58) Field of Classification Search .............. 257/301, 257/330, 334, E21.41, E21.262; 438/426, 438/427
See application file for complete search history.

(56) References Cited

U.S. PATENT DOCUMENTS

| 5,112,771 | A | 5/1992 | Ishii et al. |
| 5,747,839 | A | 5/1998 | Hammond et al. |
| 5,892,252 | A | 4/1999 | Hammond et al. |
| 6,551,944 | B1 * | 4/2003 | Fallica et al. ................. 438/719 |
| 6,600,189 | B1 * | 7/2003 | Sato et al. .................... 257/301 |

(Continued)

FOREIGN PATENT DOCUMENTS

KR    10-2000-269485    9/2000

(Continued)

OTHER PUBLICATIONS

Korean Intellectual Property Office, "Notice to Submit Response" corresponding to Korean Patent Application No. 10-2005-0069061, mailed Sep. 28, 2006.

*Primary Examiner*—Howard Weiss
*Assistant Examiner*—John C Ingham
(74) *Attorney, Agent, or Firm*—Myers Bigel Sibley & Sajovec, P.A.

(57) ABSTRACT

In a method of forming an asymmetric recess, an asymmetric recessed gate structure filling the asymmetric recess, a method of forming the asymmetric recessed gate structure, a semiconductor device having the asymmetric recessed gate structure and a method of manufacturing the semiconductor device, a semiconductor substrate is etched to form a first sub-recess having a first central axis. A second sub-recess is formed under the first sub-recess. The second sub-recess is in communication with the first sub-recess. The second sub-recess has a second central axis substantially parallel with the first central axis. The second central axis is spaced apart from the first central axis.

15 Claims, 15 Drawing Sheets

U.S. PATENT DOCUMENTS

| | | | |
|---|---|---|---|
| 6,720,606 B1 * | 4/2004 | Nitayama et al. | 257/306 |
| 6,770,535 B2 * | 8/2004 | Yamada et al. | 438/270 |
| 7,291,532 B2 * | 11/2007 | Tegen | 438/256 |
| 2001/0023960 A1 | 9/2001 | Soga et al. | |
| 2004/0110383 A1 * | 6/2004 | Tanaka | 438/700 |

FOREIGN PATENT DOCUMENTS

KR    1020000060693 A    10/2000

* cited by examiner

METHODS OF FORMING ASYMMETRIC RECESSES AND GATE STRUCTURES THAT FILL SUCH RECESSES AND RELATED METHODS OF FORMING SEMICONDUCTOR DEVICES THAT INCLUDE SUCH RECESSES AND GATE STRUCTURES

CROSS REFERENCE TO RELATED APPLICATION

This is a continuation-in-part of U.S. patent Ser. No. 11/285,558 filed Nov. 22, 2005, which claims priorities under 35 USC § 119 to Korean Patent Application No. 2004-98014 filed on Nov. 26, 2004, and to Korean Patent Application No. 2005-65777 filed on Jul. 20, 2005. This application claims benefit of priority under 35 U.S.C. § 119 to Korean Patent Application No. 2005-69061 filed on Jul. 28, 2005, the disclosure of which is incorporated herein by reference.

FIELD OF THE INVENTION

The present invention relates to semiconductor devices and, more particularly, to methods of forming recesses and gate structures that fill such recesses and related semiconductor devices that include such recesses and gate structures.

BACKGROUND OF THE INVENTION

As the integration of semiconductor devices has increased, the line width and other critical dimensions of patterns in the devices have decreased. Thus, techniques for forming finer, more precise patterns are desirable. When the design rule for a semiconductor device is reduced, the line width of gate structures in the device may be reduced. Thus, metal oxide semiconductor (MOS) transistors having recessed gate electrodes have been provided to increase the length of the channel of such transistors.

FIGS. 1A and 1B are cross-sectional diagrams illustrating a conventional recess. FIG. 1A is taken along a first direction (the direction in which the active region extends). FIG. 1B is taken along a second direction that is substantially perpendicular to the first direction. A word line may run substantially parallel to the second direction.

As shown in FIG. 1B, if a recess 14 in a conventional semiconductor device is formed by partially etching an active region of a semiconductor substrate 10, a silicon fence 16 that extends in a first direction (the direction in which the active region extends) may be formed on a sidewall of an isolation layer 12. As shown in FIG. 1A, a wet etching process may be performed to remove the silicon fence 16 from the sidewall of the isolation layer 12 after the recess 14 is formed. The wet etch, however, may recess a sidewall of the recess 14 toward the isolation layer 14, thereby generating a bowing defect. In addition, a critical dimension (CD) of the recess 14 may increase in the wet etching process which can result in alignment errors in succeeding processes.

SUMMARY OF THE INVENTION

Some embodiments of the present invention provide a method of forming an asymmetric recess.

Some embodiments of the present invention provide an asymmetric recessed gate structure that may fill an asymmetric recess.

Some embodiments of the present invention provide a method of manufacturing the above asymmetric recessed gate structure.

Some embodiments of the present invention provide a semiconductor device having the above asymmetric recessed gate structure.

Some embodiments of the present invention provide a method of manufacturing the above semiconductor device.

In accordance with some embodiments of the present invention, there is provided a method of forming a recess. In the method, a semiconductor substrate is etched to form a first sub-recess having a first central axis. A second sub-recess is formed under the first sub-recess. The second sub-recess is in communication with the first sub-recess. The second sub-recess has a second central axis substantially in parallel with the first central axis. The second central axis is spaced apart from the first central axis. For example, the first and second sub-recesses are formed by an anisotropic etching process and an isotropic etching process, respectively. The second sub-recess expands in a direction away from the first central axis. The direction is substantially perpendicular to the first central axis.

In some embodiments, the first sub-recess has a first side face and a second side face facing the first side face. First and second mask patterns may be formed on the first and second side faces, respectively, the first and second mask patterns having first and second lengths, respectively, the second length being substantially larger than the first length. In this case, the second sub-recess is extended under the first mask pattern.

In some embodiments, the first and second mask patterns include substantially the same material. For example, the first and second mask patterns include silicon oxide, silicon nitride or metal nitride.

In some embodiments, in order to form the first and second mask patterns, a mask layer is formed on the first side face, the second side face and a bottom face of the first sub-recess. The mask layer has a first side portion, a second side portion and a bottom portion that are located on the first side face, the second side face and the bottom face, respectively, of the sub-recess. An auxiliary mask pattern is formed on the second side portion of the mask layer to partially cover the bottom portion of the mask layer. An anisotropic etching process is performed on the mask layer by using the auxiliary mask pattern as an etching mask to form the first and second mask patterns. The first mask pattern corresponds to the first side portion of the mask layer. The second mask pattern corresponds to a portion of the mask layer located between the auxiliary mask pattern and the semiconductor substrate.

In some embodiments, the mask layer and the auxiliary mask pattern include substantially different materials. The mask layer may include silicon oxide, silicon nitride, photoresist, metal oxide or metal nitride. The auxiliary mask pattern includes silicon oxide, silicon nitride, photoresist, metal oxide or metal nitride.

In some embodiments, in order to form the first and second mask patterns, a first mask layer is formed on the first side face, the second side face and a bottom face of the first sub-recess. The first mask layer is etched to form the first mask patterns on the first and second side faces of the first sub-recesses. A portion of the semiconductor substrate exposed between the first mask patterns is etched to form a preliminary second sub-recess. The second mask pattern is formed on the second side face on which the first mask pattern is formed.

In accordance with some embodiments of the present invention, there is provided a method of forming an asymmetric recess. In the method, a semiconductor substrate is etched to form first and second sub-recesses having first and second central axes, respectively. The first central axis is substantially in parallel with the second central axis. Third and fourth sub-recesses are formed under the first and second sub-recesses, respectively. The third and fourth sub-recesses are in communication with the first and second sub-recesses, respectively. The third and fourth sub-recesses have third and fourth central axes, respectively. The third and fourth central axes are substantially in parallel with the first and second central axes, respectively. The third and fourth sub-recesses are extended (or enlarged) in substantially opposite directions away from the first and second central axes. The opposite directions are substantially perpendicular to the first and second central axes.

In some embodiments, an isolation layer is formed at the semiconductor substrate to define an active region and a field region, the isolation layer including first and second portions that are located on opposite sides of the active region. The first and second sub-recesses are formed at the active region. The first sub-recess has first and second side faces. The first side face is adjacent to the first portion of the isolation layer. The second side face confronts the first side face. The second sub-recess has third and fourth side faces. The third side face is adjacent to the second portion of the isolation layer. The fourth side face confronts the third side face. First and second mask patterns are formed before forming the third and fourth sub-recesses. The first mask patterns are located on the first and third side faces. The second mask patterns are located on the second and fourth side faces. The first and second mask patterns have first and second lengths, respectively. The second length is substantially larger than the first length. The second mask patterns may be formed as one body.

In accordance with some embodiments of the present invention, an asymmetric recessed gate structure includes a gate insulation layer and a gate electrode. The gate insulation layer is formed on an inner face of an asymmetric recess including first and second sub-recesses having first and second central axes, respectively. The second sub-recess is provided under the first sub-recess to be in communication with the first sub-recess. The second central axis is substantially in parallel with the first central axis. The second central axis is spaced apart from the first central axis. The gate electrode is formed on the gate insulation layer to fill up the asymmetric recess partially filled with the gate insulation layer.

In accordance with some embodiments of the present invention, a semiconductor device includes a semiconductor substrate, an isolation layer, a first asymmetric recess, a second asymmetric recess, a first gate insulation layer, a second gate insulation layer, a first gate electrode and a second gate electrode. The isolation layer is formed at the semiconductor substrate to define an active region and a field region. The isolation layer has first and second portions that are located on opposite sides of the active region. The first asymmetric recess is formed at the active region. The first asymmetric recess is adjacent to the first portion of the isolation layer. The first asymmetric recess includes first and second sub-recesses having first and second central axes, respectively. The second sub-recess is formed under the first sub-recess to be in communication with the first sub-recess. The second central axis is substantially in parallel with the first central axis. The second central axis is spaced apart from the first central axis. The second asymmetric recess is formed at the active region. The second asymmetric recess is adjacent to the second portion of the isolation layer. The second asymmetric recess includes third and fourth sub-recesses having third and fourth central axes, respectively. The fourth sub-recess is formed under the third sub-recess to be in communication with the third sub-recess. The fourth central axis is substantially in parallel with the third central axis. The fourth central axis is spaced apart from the third central axis. The first gate insulation layer is formed on the active region and an inner face of the first asymmetric recess. The second gate insulation layer is formed on the active region and an inner face of the second asymmetric recess. The first gate electrode is formed on the first gate insulation layer to fill up the first asymmetric recess partially filled with the first gate insulation layer. The second gate electrode is formed on the second gate insulation layer to fill up the second asymmetric recess partially filled with the second gate insulation layer. The isolation layer has a sidewall forming an interior angle of about 70° to about 90° with an upper face of the semiconductor device. The semiconductor device may further include a first source/drain region and a second source/drain region. The first source/drain region has a first junction formed at a portion of the semiconductor substrate, the portion being located between the third sub-recess and the first portion of the isolation layer. The second source/drain region has a second junction formed at a portion of the semiconductor substrate, the portion being located between the fourth sub-recess and the second portion of the isolation layer.

In accordance with some embodiments of the present invention, there is provided a method of manufacturing a semiconductor device. In the method, a semiconductor substrate is etched to form first and second sub-recesses having first and second central axes, respectively. The first central axis is substantially in parallel with the second central axis. The first central axis is spaced apart from the second central axis. Third and fourth sub-recesses are formed under the first and second sub-recesses, respectively. The third and fourth sub-recesses are in communication with the first and second sub-recesses, respectively. The third and fourth sub-recesses have third and fourth central axes, respectively. The third and fourth central axes are substantially in parallel with the first and second central axes, respectively. The third and fourth central axes are spaced apart from the first and second central axes, respectively. The third and fourth sub-recesses are extended in substantially opposite directions away from the first and second central axes. The opposite directions are substantially perpendicular to the first and second central axes. A first gate insulation layer is formed on the semiconductor substrate and inner faces of the first and third sub-recesses. A second gate insulation layer is formed on the semiconductor substrate and inner faces of the second and fourth sub-recesses. A first gate electrode is formed on the first gate insulation layer to fill up the first and third sub-recesses that are partially filled with the first gate insulation layer. A second gate electrode is formed on the second gate insulation layer to fill up the second and fourth sub-recesses that are partially filled with the second gate insulation layer.

According to some embodiments of the present invention, a lower portion of an asymmetric gate structure has an extended cross section with a substantial circular shape, a substantial oval shape or a substantial track shape. The term "track shape" is defined herein to mean any generally circular or oval shape and that may or may not include one or more generally linear sections. Thus, a length of a channel formed around the lower portion of the asymmetric gate structure may be also extended. In addition, because the lower portion of the asymmetric gate structure is extended toward an isolation layer, a width of a junction formed between the isolation layer and the lower portion of the asymmetric gate structure may decrease. Thus, a leakage current through the junction may decrease. Furthermore, an interval between the asymmetric gate structures may be kept substantially constant. Thus, a noise unfortunately generated between the asymmetric gate structures may decrease. As a result, a semiconductor device including the asymmetric gate structure may have improved characteristics such as a reduced leakage current or an extended retention time.

BRIEF DESCRIPTION OF THE DRAWINGS

The above and other advantages of the present invention will become readily apparent by reference to the following detailed description when considered in conjunction with the accompanying drawings in which.

DETAILED DESCRIPTION

Figure 1A:
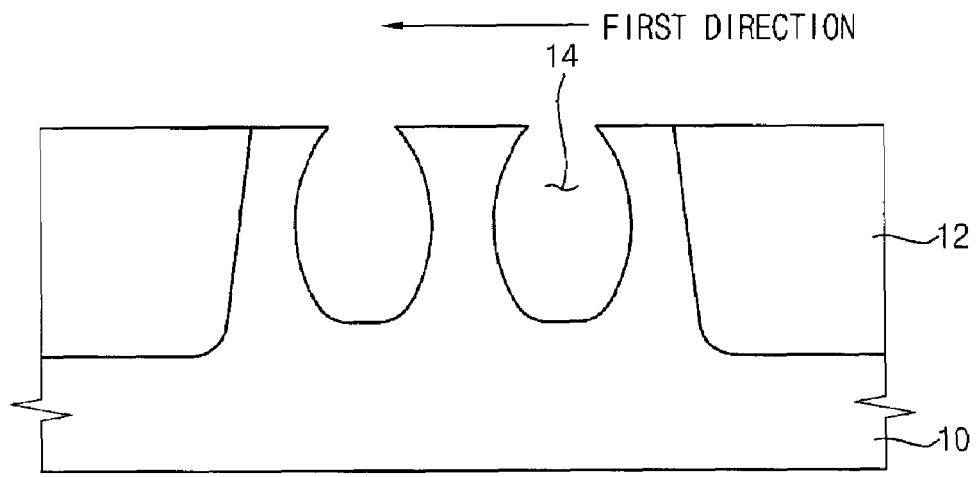
FIGS. 1A and 1B are cross-sectional diagrams illustrating a recess in a conventional semiconductor device.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings are not to scale. Like reference numerals designate like elements throughout the drawings.

It will also be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Figure 2A:
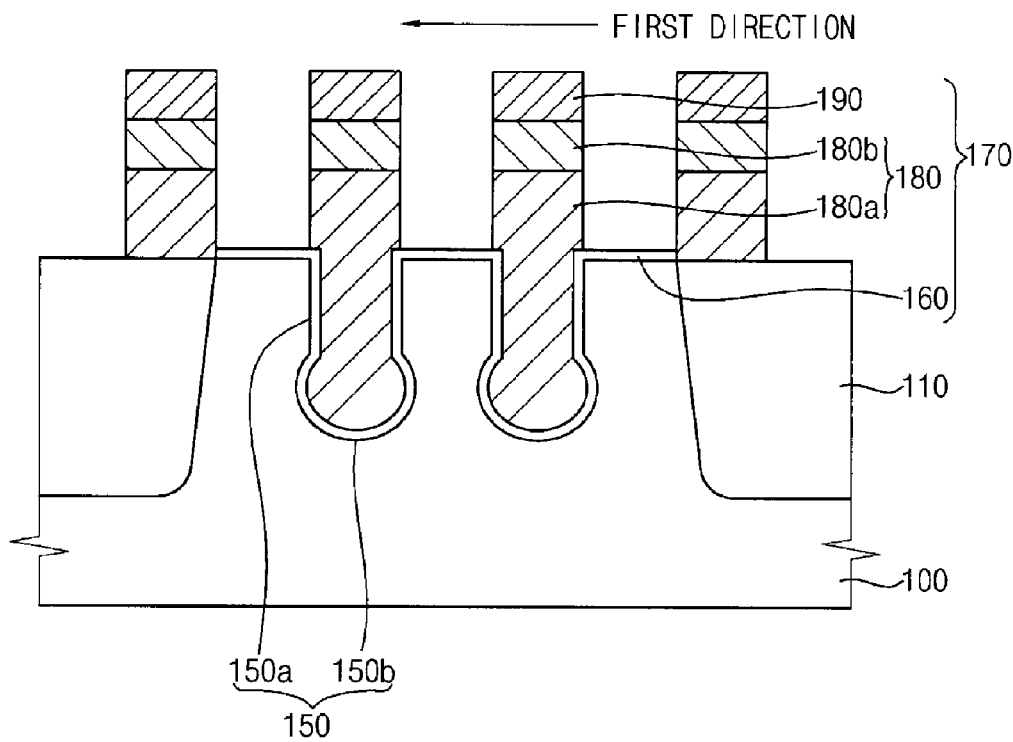
FIGS. 2A and 2B are cross-sectional diagrams illustrating a recessed gate in accordance with embodiments of the present invention.
Figure 2B:
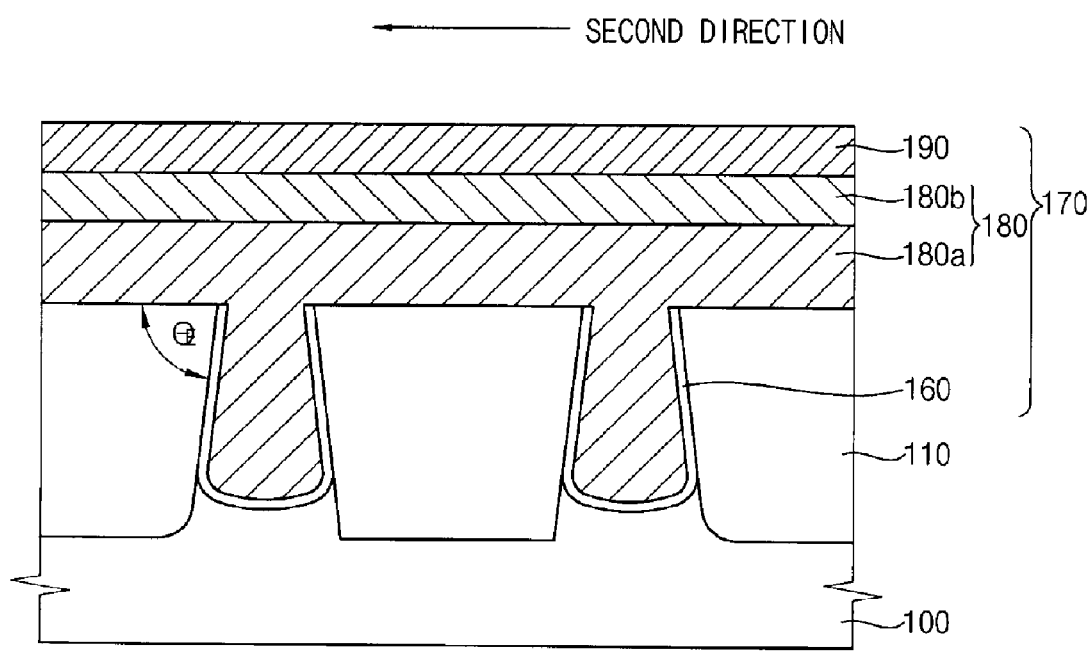

FIGS. 2A and 2B are cross-sectional diagrams illustrating a recessed gate in accordance with certain embodiments of the present invention. FIG. 2A is a cross-section taken along a first direction, which is the direction in which the active region extends. FIG. 2B is a cross-section taken along a second direction that is substantially perpendicular to the first direction. The second direction may be substantially parallel to a word line in which the recessed gate structure extends.

As shown in FIGS. 2A and 2B, a recessed gate 170 is provided on a semiconductor substrate 100. A lower portion of the recessed gate 170 is lodged in the semiconductor substrate 100. An upper portion of the recessed gate 170 protrudes upwardly from an upper face of the semiconductor substrate 100. The recessed gate 170 includes a gate insulation layer 160, a gate electrode 180 and a gate mask 190.

An isolation layer 110 is provided at an upper portion of the semiconductor substrate 100. The isolation layer 110 may divide the semiconductor substrate 100 into a field region and an active region that extends in the first direction. The isolation layer 110 may be formed, for example, by a shallow trench isolation (STI) process. In the STI process, a trench is formed at the upper portion of the semiconductor-substrate 100. The trench is then filled with oxide to form the isolation layer 110.

The recess 150 is formed at the active region of the semiconductor substrate 100. The isolation layer 110 defines the recess 150 in a second direction that is substantially perpendicular to the first direction. The recess 150 includes a first portion (or a "first sub-recess") 150a and second portion (or a "second sub-recess") 150b that are in communication with each other. The first sub-recess 150a is located over the second sub-recess 150b. The gate electrode 180 of the recessed gate 170 may fill the first and second sub-recesses 150a and 150b.

The first sub-recess 150a has first and second side faces that extend in the first and second directions, respectively. The first side face may form an external angle ($\theta_E$) of about 70° to about 90° with an upper face of the semiconductor substrate 100. The second side face of the first sub-recess 150a may be substantially vertical. A first cross section of the second sub-recess 150b, the cross section being taken along the first direction, may have a rounded and/or curved shape as shown, for example, in FIG. 2A. As illustrated in FIG. 2B, a silicon fence is not formed on a sidewall of the isolation layer 110. Thus, the isolation layer 110 may directly define the first and second sub-recesses 150a and 150b in the second direction. A bottom face of the second sub-recess 150b may be rounded. As shown in FIG. 2A, the width of the second sub-recess 150b may be larger than the width of the first sub-recess 150a. That is, the second sub-recess 150b may more expand than the first sub-recess 150a.

A gate insulation layer 160 is provided on the active region and an inner face of the recess 150. The gate electrode 180 is provided on the gate insulation layer 160. The gate electrode 180 extends in the second direction.

The gate electrode 180 may include first and second conductive film patterns 180a and 180b. The first conductive film pattern 180a may comprise, for example, polysilicon doped with impurities. The second conductive film pattern 180b may comprise, for example, a metal silicide or a metal. A lower portion of the first conductive film pattern 180a may fill the recess 150. An upper portion of the first conductive film pattern 180a may protrude upwardly from the upper face of the semiconductor substrate 100. A gate mask 190 may be provided on the second conductive film pattern 180b. The gate mask 190 may comprise a nitride such as, for example, silicon nitride.

FIGS. 3A-3D are cross-sectional diagrams illustrating methods of manufacturing the recessed gate 170 of FIGS. 2A and 2B. Each of FIGS. 3A-3D are taken along the first direction (i.e., the direction in which the active region extends). The same reference numerals will be used in FIGS. 3A-3D in order to designate the same parts as those described in FIGS. 2A and 2B.

Figure 3A:
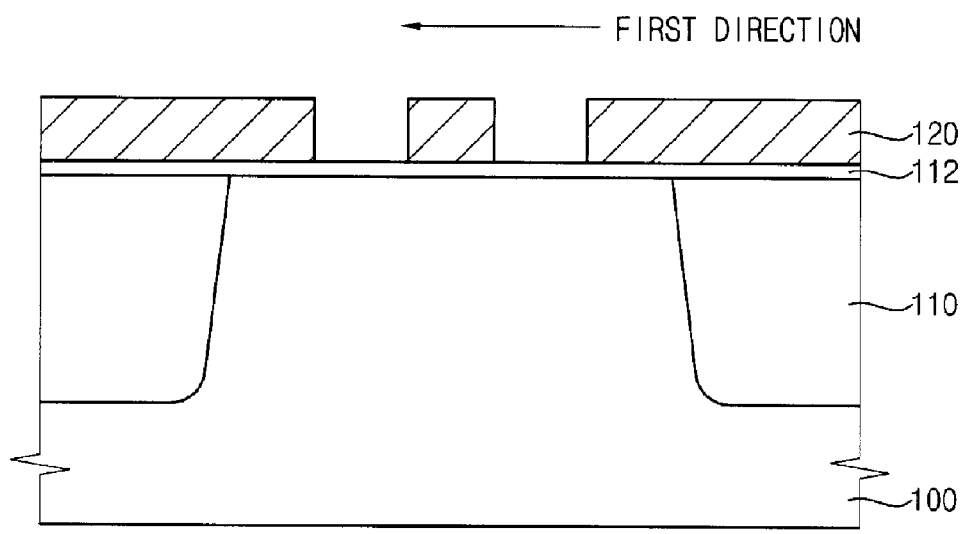
FIGS. 3A to 3D are cross-sectional diagrams illustrating a method of manufacturing the recessed gate of FIGS. 2A and 2B.

As shown in FIG. 3A, an isolation layer 110 is formed at an upper portion of a semiconductor substrate 100 by an isolation process. The isolation layer 110 may divide the semiconductor substrate 100 into a field region and an active region that extends in a first direction. The isolation process may be, for example, an STI process or a local oxidation of silicon (LOCOS) process.

A buffer oxide layer 112 may then be formed on the semiconductor substrate 100. A mask pattern 120 having an opening exposing a portion of the active region where a preliminary first sub-recess 130 (see FIG. 3B) is to be formed is formed on the buffer oxide layer 112. The buffer oxide layer 112 may be formed, for example, by a thermal oxidation process or a chemical vapor deposition (CVD) process. The mask pattern 120 may have an etching selectivity with respect to the buffer oxide layer 112 and the semiconductor substrate 100. For example, the mask pattern 120 may comprise a nitride such as a silicon nitride or an oxynitride such as silicon oxynitride.

Figure 3B:
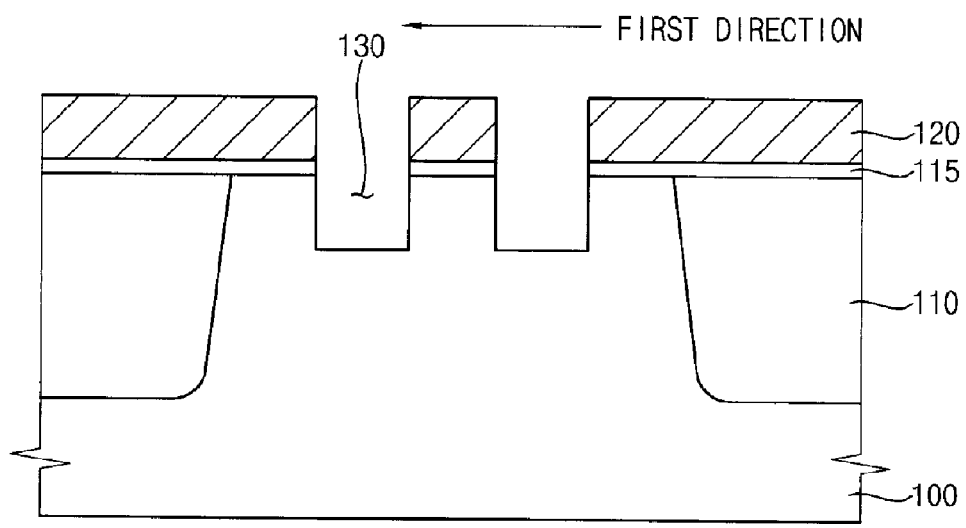

Referring to FIG. 3B, the buffer oxide layer 112 and the semiconductor substrate 100 are then etched using the mask pattern 120 as an etching mask to form a buffer oxide layer pattern 115 and the preliminary first sub-recess 130. As shown in FIG. 3B, the buffer oxide layer pattern 115 is formed under the mask pattern 120. The preliminary first sub-recess 130 is formed at the active region. The preliminary first sub-recess 130 may be formed, for example, by a dry etching process or by a dry etching process and a wet cleaning process.

Figure 3C:
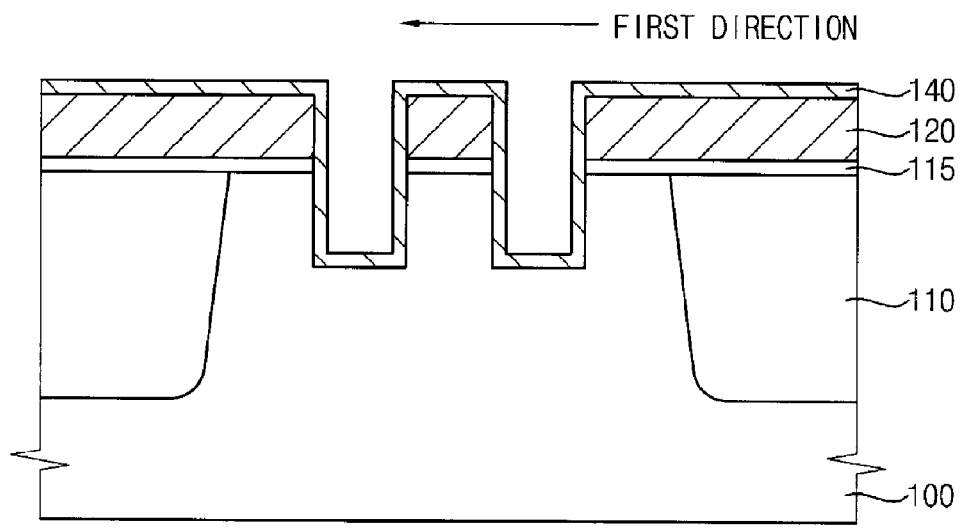
Figure 3D:
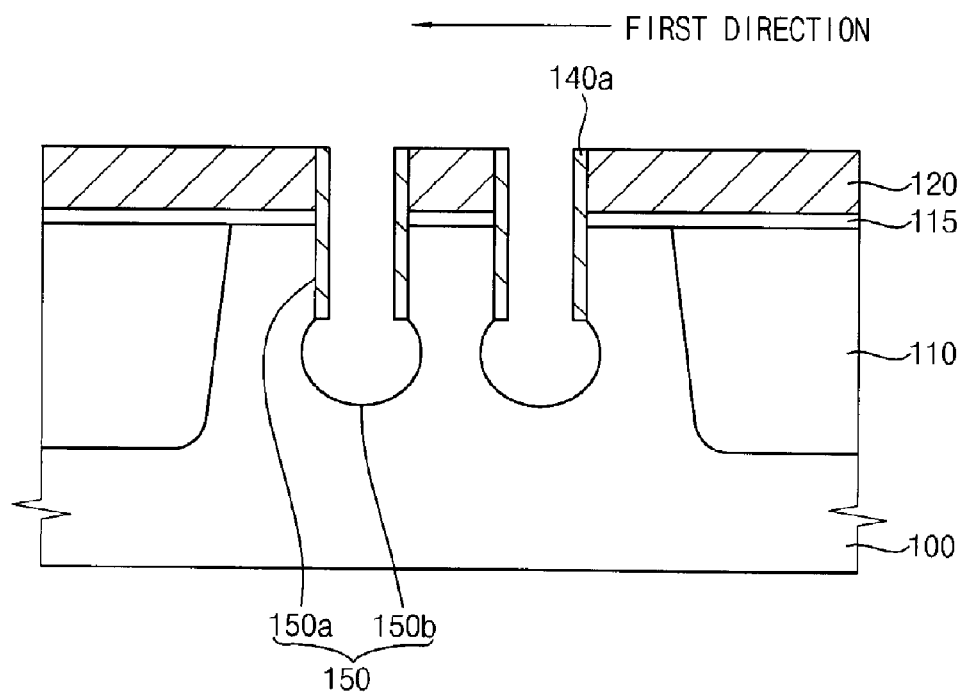

The preliminary first sub-recess 130 has a second depth that is substantially smaller than the first depth of the first sub-recess 150a (see FIG. 3D). The second depth of the preliminary first sub-recess 130 may be sufficiently deep to suppress formation of a silicon fence extending in the first direction on a sidewall of the isolation layer 110. Because the silicon fence is not formed, a recess 150 (see FIG. 3D) may be defined directly by the isolation layer 110 in a second direction that is substantially perpendicular to the first direction.

Referring to FIG. 3C, a protection layer 140 is formed on the mask pattern 120 and an inner face of the preliminary first sub-recess 130. The protection layer 140 may prevent side faces of the preliminary first sub-recess 130 from being etched in a subsequent etching process. The protection layer 140 may have an etching selectivity with respect to the semiconductor substrate 100. Thus, the protection layer 140 may be hardly etched in an etching solution or an etching gas that is utilized to etch the semiconductor substrate 100. The protection layer 140 may be formed, for example, of silicon oxide, silicon nitride and/or titanium nitride. These may be used alone or in combination.

Referring to FIG. 3D, the protection layer 140 is anisotropically etched to form a protection layer pattern 140a on a side face of the preliminary first sub-recess 130. The protection layer pattern 140a may protect the sidewall of the preliminary first sub-recess 130 in subsequent etching process (es).

An isotropic etching process is performed on the portion of the semiconductor substrate 100 that is exposed at the bottom of the preliminary first sub-recess 130, by using the mask pattern 120 and the protection layer pattern 140 together as an etching mask. This isotropic etching process forms a second sub-recess 150b under the first sub-recess 150a. This isotropic etching process also converts the preliminary first sub-recess 130 (which has the second depth) into a first sub-recess 150a that has the first depth that is substantially larger than the second depth. The recess 150 comprises the first and second sub-recesses 150a and 150b that are formed by the isotropic etching process. As shown in FIG. 3D, the second sub-recess 150b may be more extended (wider) than the first sub-recess 150a. In addition, the cross section of the second sub-recess 150b may have a rounded shape. The second sub-recess 150b may be formed, for example, by a wet etching process or a chemical dry etching process.

As described above, the recess 150 may be formed by an isotropic etching process. As such, the silicon fence extending in the first direction may hardly form on the sidewall of the isolation layer 110. Thus, the recess 150 may be defined directly by the isolation layer 110 in the second direction. In addition, the protection layer pattern 140a formed on a side face of the first sub-recess 150a may prevent a width of the first sub-recess 150a from expanding during the isotropic etching process. Thus, an alignment error due to an expansion of the width of the first sub-recess 150a may be prevented.

Referring again to FIGS. 2A and 2B, the protection layer pattern 140a is removed from the side face of the first sub-recess 150a. The mask pattern 120 and the buffer oxide layer pattern 115 are subsequently removed from the semiconductor substrate 100. A gate insulation layer 160 is formed on the active region and on inner faces of the recess 150. A gate electrode layer is then formed on the semiconductor substrate 100 to cover the gate insulation layer 160. The gate electrode layer may fill the recess 150. The gate electrode layer may comprise, for example, a metal film, a silicide film and/or a polysilicon film doped with impurities. These may be used alone or in combination. For example, in one embodiment, a polysilicon film may be formed on the semiconductor substrate 100 to cover the gate insulation layer 160 to a sufficient depth to fill the recess 150. A metal film and/or a silicide film may be then formed on the polysilicon film.

A gate mask 190 is formed on the gate electrode layer. Thereafter, the gate electrode layer is partially etched using the gate mask 190 as an etching mask to form a gate insulation layer 160. Thus, a recessed gate 170 including the gate mask 190, the gate electrode 180 and the gate insulation layer 160 may be manufactured.

Figure 4:
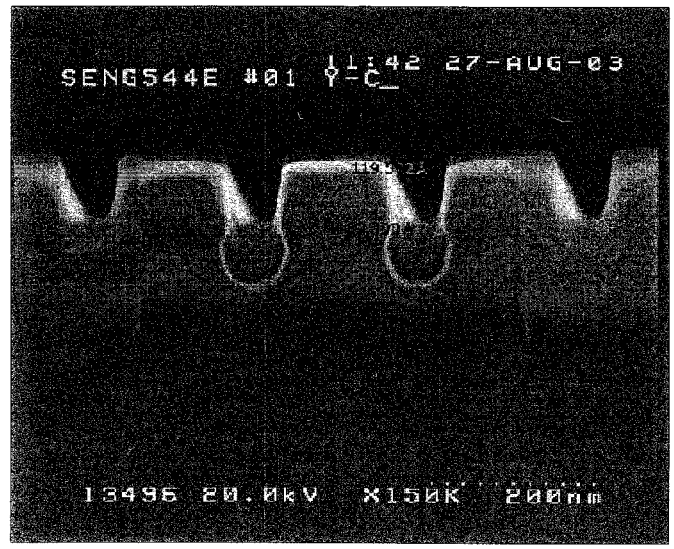
FIG. 4 is a scanning electron microscope (SEM) photograph showing a first cross section of a recess formed by the method illustrated in FIGS. 3A to 3D.
Figure 5:
FIG. 5 is a SEM picture showing a second cross section of the recess formed by the method illustrated in FIGS. 3A to 3D.

FIG. 4 is a scanning electron microscope (SEM) photograph showing a first cross section of a recess formed by the method illustrated with respect to FIGS. 3A-3D. The first cross section was taken along the first direction in which the active region extends. FIG. 5 is a SEM photograph showing a second cross section of the recess. The second cross section was taken along a second direction that is substantially perpendicular to the first direction.

Figure 1B:
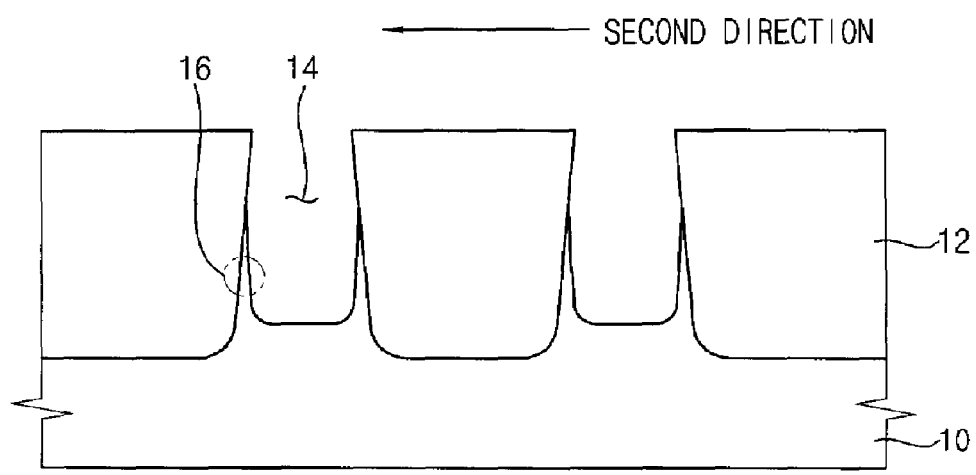

As shown in FIGS. 4 and 5, the second sub-recess of the recess is rounded. The silicon fence shown in FIG. 1 that extends in the first direction in prior art devices is not formed on the sidewall of the isolation layer. Thus, the recess is defined directly by the isolation layer in the second direction. In addition, because the second sub-recess is more extended than the first sub-recess, the length of the channel formed around the second sub-recess is increased. Furthermore, because a critical dimension (CD) of the first sub-recess was smaller than the corresponding critical dimension of the second sub-recess, an alignment error in etching processes for manufacturing a recessed gate may be reduced and/or prevented.

FIGS. 6A-6E are cross-sectional diagrams illustrating methods of forming an asymmetric recess in accordance with embodiments of the present invention.

Figure 6A:
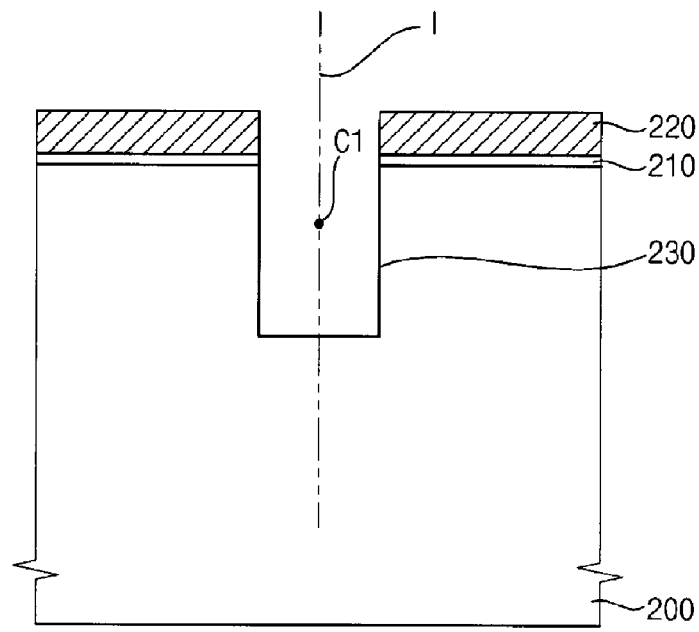
FIGS. 6A to 6E are cross-sectional diagrams illustrating a method of forming an asymmetric recess in accordance with embodiments of the present invention.

Referring to FIG. 6A, a buffer oxide layer (not shown) is formed on a semiconductor substrate 200. The semiconductor substrate 200 may be, for example, a silicon wafer or a silicon-on-insulator (SOI) substrate. A hard mask pattern 220 having a hole exposing a portion of the semiconductor substrate 200 where a first sub-recess 230 is to be formed is formed on the buffer oxide layer.

The buffer oxide layer may be formed, for example, by a CVD process or a thermal oxidation process. The hard mask pattern 220 may have an etching selectivity with respect to the buffer oxide layer and the semiconductor substrate 200. For one example, the hard mask pattern 220 may comprise a nitride such as silicon nitride and/or may comprise an oxynitride such as silicon oxynitride. The hard mask pattern 220 may be formed, for example, by a CVD process and a photolithography process.

An anisotropic etching process is performed on the buffer oxide layer and the semiconductor substrate 200 using the hard mask pattern 220 as an etching mask to form the first sub-recess 230 at the semiconductor substrate 200 and a buffer oxide layer pattern 210. The first sub-recess 230 vertically extends. A first central axis I of the first sub-recess 230 may be substantially perpendicular to an upper face of the semiconductor substrate 200. In addition, a first central point C1 of the first sub-recess 230 lies on the first central axis I.

As described above, the first sub-recess 230 may be formed by the anisotropic etching process. The anisotropic etching process may be, for example, a reactive ion etch (RIE) process or a chemical dry etch (CDE) process. Because the first sub-recess 230 is formed by the anisotropic etching process, the first sub-recess 230 may extend vertically.

Figure 6B:
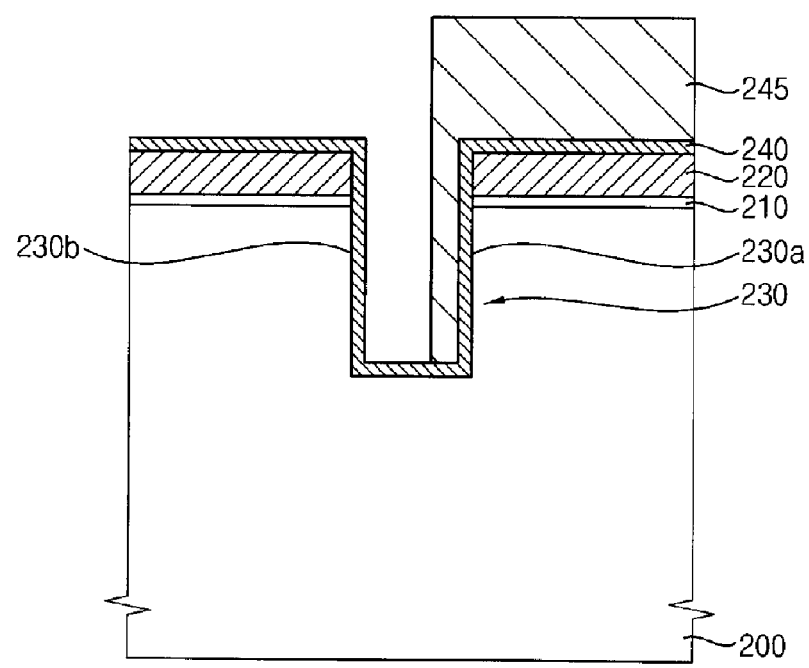

Referring to FIG. 6B, a first mask layer 240 is formed on the hard mask pattern 220 and on first and second side (inner) faces 230a and 230b of the first sub-recess 230. The first mask layer 240 has an etching selectivity with respect to the semiconductor substrate 200. As one example, the first mask layer 240 is formed using oxide such as silicon oxide. As another example, the first mask layer 240 is formed using nitride such as silicon nitride and/or titanium nitride. The first mask layer 240 may be formed, for example, by a CVD process, a plasma enhanced chemical vapor deposition (PE-CVD) process, a sputtering process or an atomic layer deposition (ALD) process.

An auxiliary mask layer (not shown) is formed on the first mask layer 240 to fill the remainder of the first sub-recess 230. Next, the auxiliary mask layer is partially removed to form a second mask pattern 245. The auxiliary mask layer may have an etching selectivity with respect to the first mask layer 240. As one example, the auxiliary mask layer is formed using photoresist. As another example, the auxiliary mask layer is formed using oxide, nitride, oxynitride or metal. The auxiliary mask layer may be formed, for example, by a spin coating process, a CVD process, a PE-CVD process, a sputtering process or an ALD process. For example, the auxiliary mask layer is formed using the photoresist by the spin coating process.

Because the auxiliary mask layer is partially removed to form the auxiliary mask pattern 245, portions of the first mask layer 240 located on the hard mask pattern 220 or a bottom face of the first sub-recess 230 may be exposed by the auxiliary mask layer pattern 245. In particular, as shown in FIG. 6B, the portion of the first mask layer 240 located on the first side face 230a of the first sub-recess 230 may be exposed, as may part of the bottom face of the first sub-recess 230. The portion of the first mask layer 240 located on the second side face 230a of the first sub-recess 230 is covered with the auxiliary mask pattern 245 in the embodiment depicted in FIG. 6B.

Figure 6C:
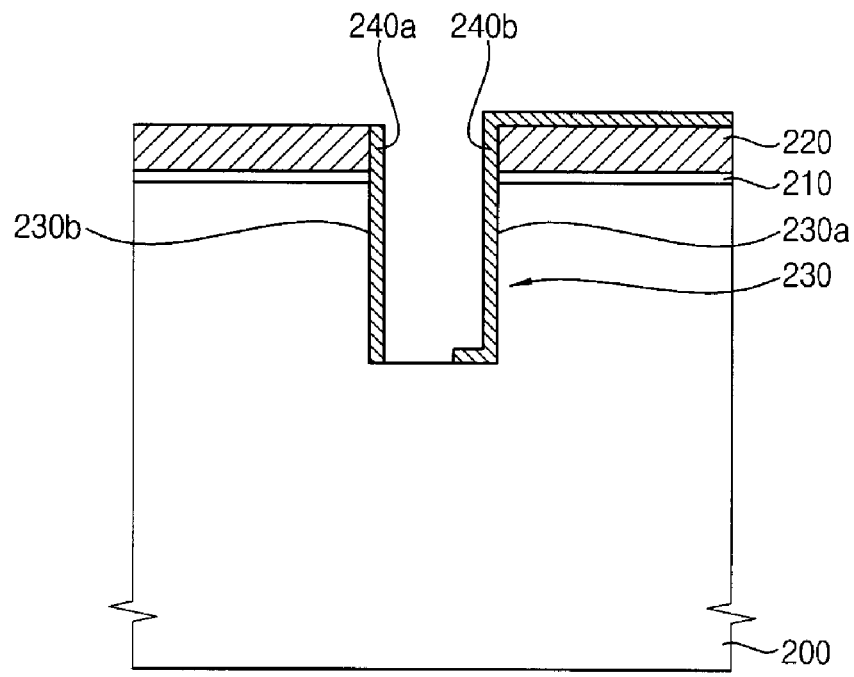

As shown in FIG. 6C, the portions of the first mask layer 240 exposed by the auxiliary mask pattern 220 may be removed by an anisotropic etching process. The auxiliary mask pattern 245 is used as an etching mask in the anisotropic etching process. Thus, a first mask pattern 240a having a first length is formed on the second side face 230b of the first sub-recess 230. On the other hand, a second mask pattern 240b having a second length substantially longer than the first length is formed on the first side face 230a of the first sub-recess 230. The first mask pattern 240a faces the second mask pattern 240b. Because the first and second mask patterns 240a and 240b are formed by partially removing the first mask layer 240, the first and the second mask patterns 240a and 240b may include substantially the same material. Particularly, the first mask pattern 240b is formed on the second side face 230b of the first sub-recess 230. The second mask pattern 240b is formed on the first side face 230a of the first sub-recess 230. The second mask pattern 240b partially covers the bottom face of the first sub-recess 230. A portion of the bottom face of the first sub-recess 230 is exposed between the first and second mask patterns 240a and 240b.

After the first and second mask patterns 240a and 240b are formed, the auxiliary mask pattern 245 is removed. In embodiments where that the auxiliary mask pattern 245 is formed using photoresist, the auxiliary mask pattern 245 may be removed, for example, by an ashing process and/or a stripping process.

Figure 6D:
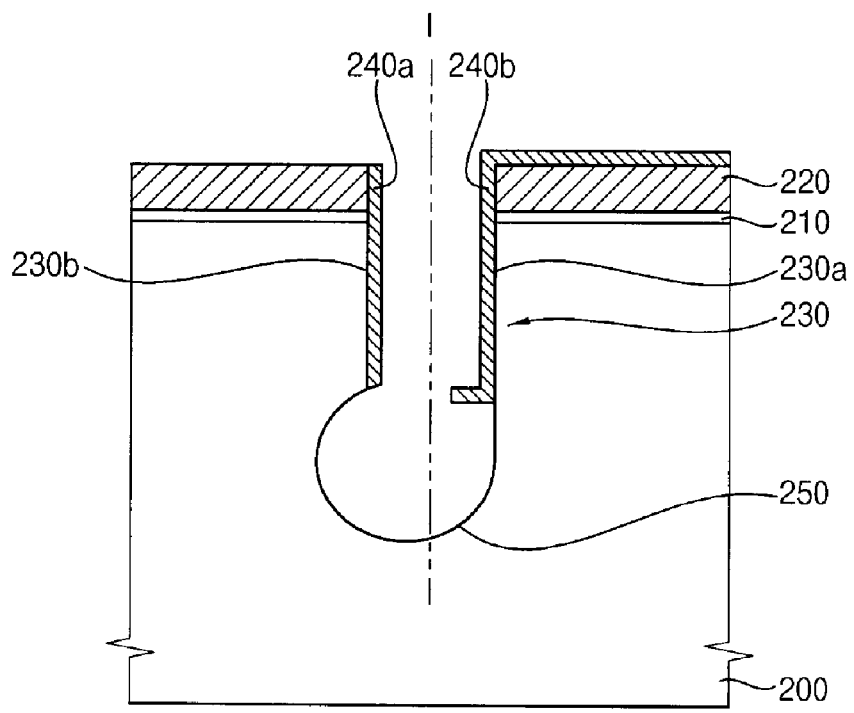

Referring to FIG. 6D, an isotropic etching process is performed on the portion of the semiconductor substrate 100 exposed between the first and second mask patterns 240a and 240b to form a preliminary second sub-recess 250 under the first sub-recess 230. The preliminary second sub-recess 250 is in communication with the first sub-recess 230. The isotropic etching process may comprise, for example, a dry etching process. An etching gas including a sulfur hexafluoride (SF$_6$) gas, a chlorine (Cl$_2$) gas and an oxygen (O$_2$) gas may be used in such a dry etching process. Because the preliminary second sub-recess 250 is formed by the isotropic etching process, a cross section of the preliminary second sub-recess 250 may generally be oval or track-shaped.

The preliminary second sub-recess 250 may isotropically expand downwardly from the first mask pattern 240a. In addition, the preliminary second sub-recess 250 isotropically expands in a horizontal direction away from the first central axis I. That is, the preliminary second sub-recess 250 includes first and second side faces located under the first and second mask patterns 240a and 240b, respectively. The first side face of the preliminary second sub-recess 250 is recessed in the horizontal direction away from the first central axis I. On the other hand, the second side face of the preliminary second sub-recess 250 may be substantially vertical.

Figure 6E:
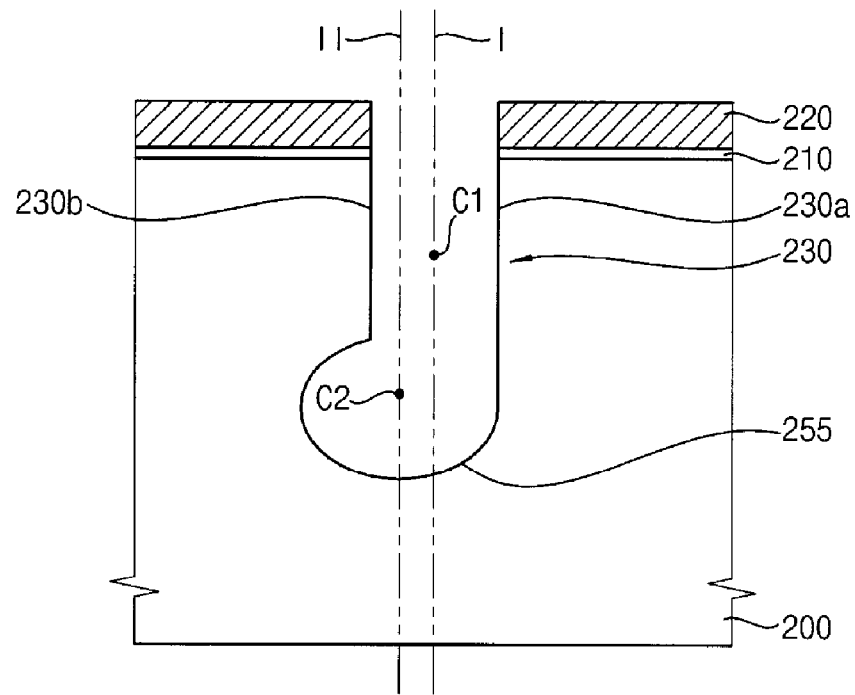

Referring to FIG. 6E, the first and second mask patterns 240a and 240b are removed from the semiconductor substrate 200 where the first sub-recess 230 and the preliminary second sub-recess 250 are formed. The first and second mask patterns 240a and 240b may be removed by a wet etching process using an etching solution. For example, the etching solution includes ammonium hydroxide (NH$_4$OH), hydrogen peroxide (H$_2$O$_2$) and pure water (H$_2$O). The preliminary second sub-recess 250 may further expand to form a second sub-recess 255 in the etching process for removing the first and second mask patterns 240a and 240b. Thus, an asymmetric recess including the first sub-recess 230 and the second sub-recess 255 may be formed.

As described above, the first sub-recess 230 has the first central axis I that is substantially perpendicular to the upper face of the semiconductor substrate 200. The second sub-recess 255 has a second central axis II that is substantially perpendicular to the upper face of the semiconductor substrate 200. The second central axis II may be horizontally spaced apart from the first central axis I by a predetermined interval. A second central point C2 of the second sub-recess 255 lies on the second central axis II. For example, a cross section of the asymmetric recess including the first and second sub-recesses 230 and 250 may be a substantial sock shape or a substantial boot shape, as illustrated in FIG. 6E.

Figure 7A:
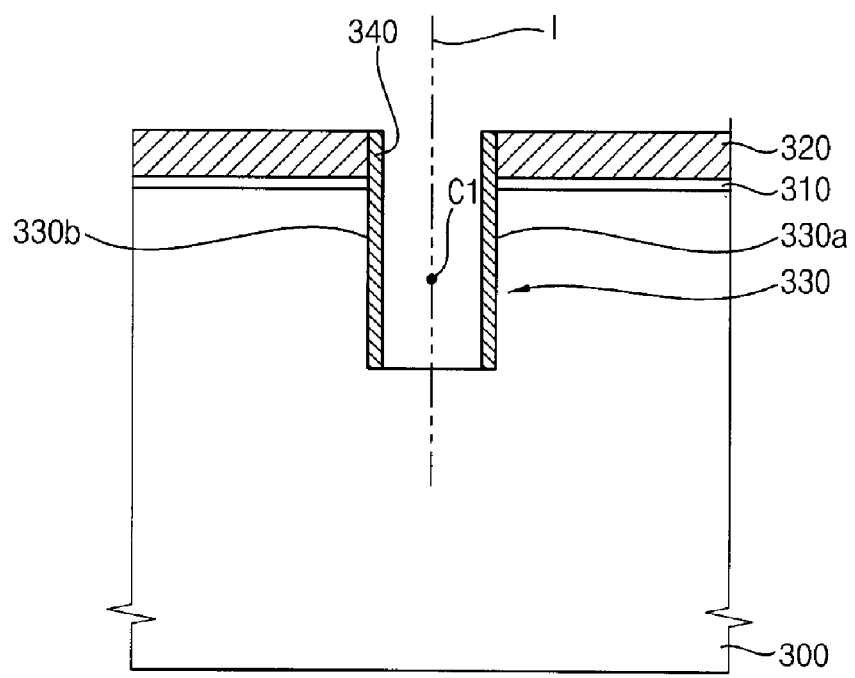
FIGS. 7A to 7C are cross-sectional diagrams illustrating a method of forming an asymmetric recess in accordance with further embodiments of the present invention.
Figure 7B:
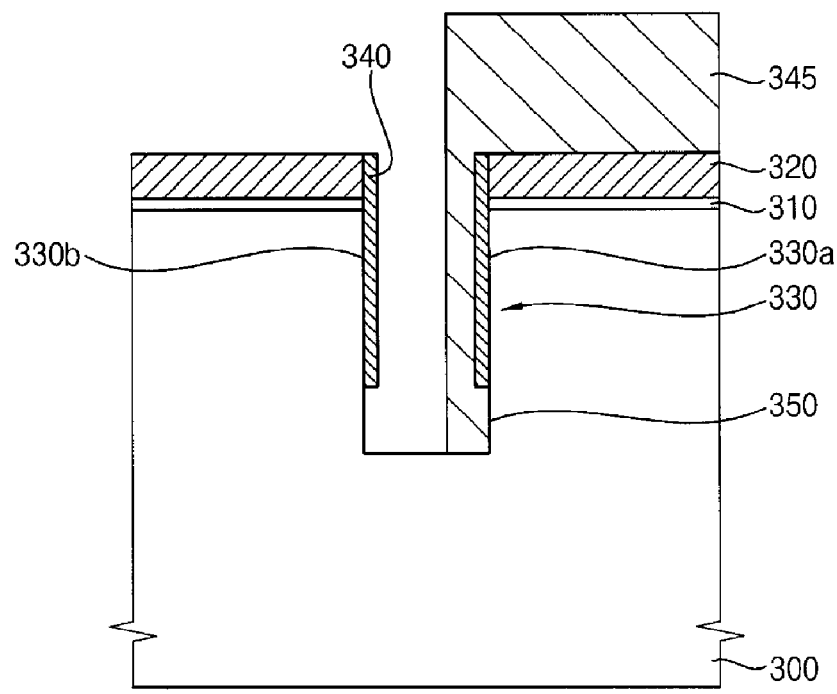
Figure 7C:
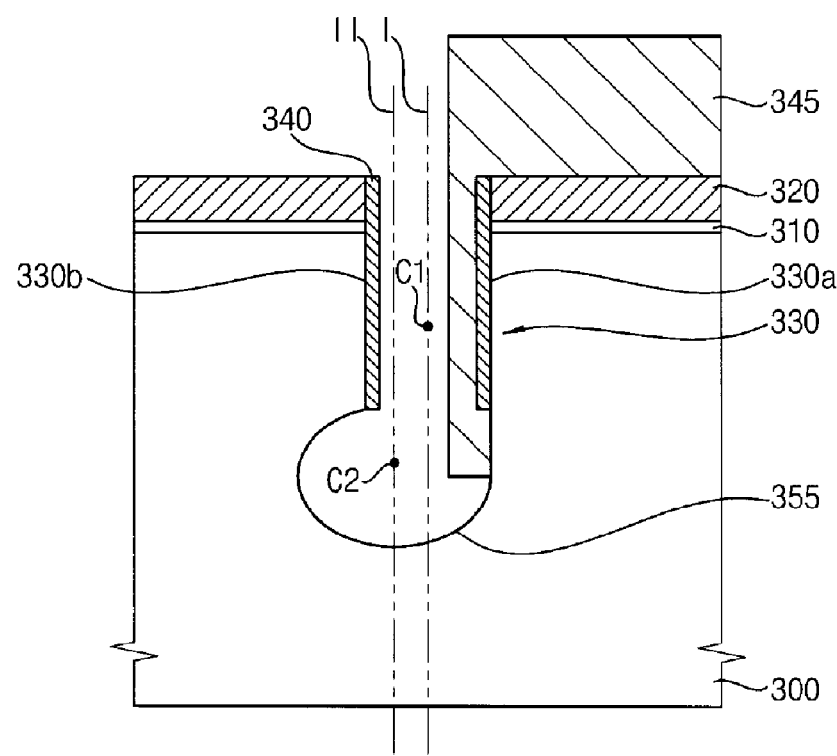

FIGS. 7A-7C are cross-sectional diagrams illustrating a method of forming an asymmetric recess in accordance with certain embodiments of the present invention.

Referring to FIG. 7A, a buffer oxide layer (not shown) and a hard mask pattern 320 are subsequently formed on a semiconductor substrate 300. The buffer oxide layer and the semiconductor substrate 300 are anisotropically etched using the hard mask pattern 320 as an etching mask to form a buffer oxide layer pattern 310 and a first sub-recess 330, respectively. The buffer oxide layer pattern 310 is formed under the hard mask pattern 320. The first sub-recess is formed at an upper portion of the semiconductor substrate 300. The first sub-recess 330 may extend vertically. A first central point C1 of the first sub-recess 330 lies on a first central axis I of the first sub-recess 330. The first central axis I may be substantially perpendicular to an upper face of the semiconductor substrate 300.

A first mask layer (not shown) is formed on the hard mask pattern 320 and an inner face of the first sub-recess 330. The first mask layer may be formed by processes substantially the same as those already illustrated in FIG. 6B.

The first mask layer is etched to form first mask patterns 340 on first and second side faces 330a and 330b of the first sub-recess 330. The first mask pattern 340 has a first length. The first mask patterns 340 may be formed by an anisotropic etching process. In particular, portions of the first mask layer located on the hard mask pattern 320 and a bottom face of the first sub-recess 330 are removed in the anisotropic etching process to form the first mask patterns 340 on the first and second side faces 330a and 330b.

Referring to FIG. 7B, the portion of the semiconductor substrate 300 exposed on the bottom face of the semiconductor substrate 300 is anisotropically etched so that a preliminary second sub-recess 350 may be formed under the first sub-recess 330. A central axis of the preliminary second sub-recess 350 may be substantially the same as the first central axis I of the first sub-recess 330.

A second mask layer (not shown) is formed on the hard mask pattern 320 to fill the first sub-recess 330 and the preliminary second sub-recess 350. The second mask layer may be formed, for example, by processes substantially the same as those already illustrated in FIG. 6B. Thus, any further explanations will be omitted.

The second mask layer is partially removed so that a second mask pattern 345 may be formed. The second mask pattern 345 may cover a side face of the preliminary second sub-recess 350 and the first mask pattern 340 on the first side face 330a. Particularly, the second mask pattern 345 continuously covers the side face of the preliminary second sub-recess 350, the first mask pattern 340 on the first side face 330a and an upper face of the hard mask pattern 320. The second mask pattern 345 extends to a bottom face of the preliminary second sub-recess 350 so that the second mask pattern 345 has a second length that is substantially larger than the first length of the first mask pattern 340. The first and second mask patterns 340 and 345 may comprise-first and second materials, respectively. The first material may be oxide, nitride, photoresist, metal oxide or metal nitride. The second material may also be oxide, nitride, photoresist, metal oxide or metal nitride. However, the first material is substantially different from the second material.

Referring to FIG. 7C, the portion of the semiconductor substrate 300 exposed between the first and second mask patterns 340 and 345 is isotropically etched using the first and second mask patterns 340 and 345 together as an etching mask to form a second sub-recess 355 under the first sub-recess 330. The second sub-recess 355 may be formed by a dry etching process. An etching gas including, for example, a sulfur hexafluoride ($SF_6$) gas, a chlorine ($Cl_2$) gas and an oxygen ($O_2$) gas may be used in the dry etching process. In embodiments where the second sub-recess 355 is formed by the dry etching process, the second sub-recess 335 may generally have an oval or track-shape.

The first and second mask patterns 340 and 345 may determine the shape of the second sub-recess 355. As illustrated in FIG. 7C, a bottom face of the second mask pattern 345 is substantially lower than the bottom face of the first mask pattern 340. Thus, the second sub-recess 355 may isotropically expand downwardly from the first mask pattern 340. In addition, the second sub-recess 355 may isotropically expand in a horizontal direction away from the first central axis I. That is, the sidewall of the second sub-recess 355 located under the first mask pattern 340 may be recessed in the horizontal direction away from the first central axis I. A second central axis II of the second sub-recess 350 may be spaced apart horizontally from the first central axis I of the first sub-recess 330 by a predetermined interval. Thus, an asymmetric recess including the first sub-recess 330 and the second sub-recess 355 may be formed. The asymmetric recess includes the first sub-recess 330 and the second sub-recess 340 that has the second central axis II substantially in parallel with the first central axis I and horizontally spaced apart from the first central axis I.

Figure 8:
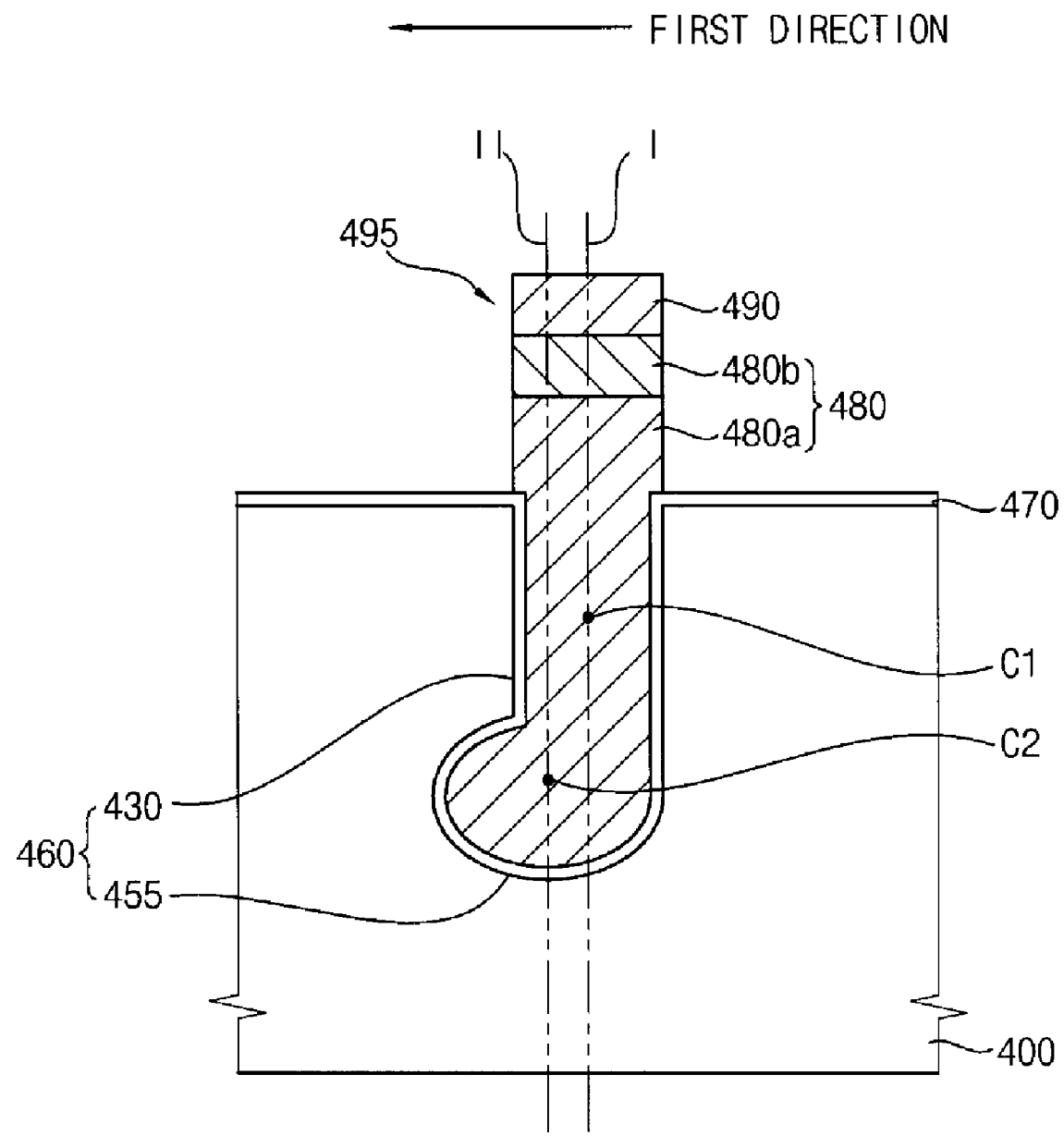
FIG. 8 is a cross-sectional diagram illustrating an asymmetric recessed gate structure in accordance with embodiments of the present invention.

FIG. 8 is a cross-sectional diagram illustrating an asymmetric recessed gate structure in accordance with some embodiments of the present invention. The cross section of FIG. 8 is taken along the first direction (i.e., the direction in which the active region extends).

As shown in FIG. 8, the asymmetric recessed gate structure 495 includes a semiconductor substrate 400 that has an asymmetric recess 460, an insulation layer 470 formed on an inner face of the asymmetric recess 460, and a gate electrode 480 formed on the gate insulation layer 470 to fill the remainder of the asymmetric recess 460.

The semiconductor substrate 400 may comprise, for example, a silicon wafer or an SOI substrate. An isolation layer is formed at an upper portion of the semiconductor substrate 400 so that the semiconductor substrate 400 may be divided into a field region and an active region that extends in a first direction. The recess 460 is formed at the active region.

The asymmetric recess 460 includes first and second sub-recesses 430 and 455 that are in communication with each other. The first sub-recess 430 extends vertically in the semiconductor substrate 400. Although it is not particularly illustrated in FIG. 8, a side face of the first sub-recess 430, the side face extending in the first direction, may form an external angle with an upper face of the semiconductor substrate 400. That is, a width of a cross section of the first sub-recess 430, the cross section being taken in a second direction substantially perpendicular to the first direction, may be narrowed downward. The first sub-recess 430 has a first central axis I that is substantially perpendicular to the upper face of the semiconductor substrate 400. A first central point C1 of the first sub-recess 430 lies on the first central axis I. The semiconductor substrate 400 may be anisotropically etched to form the first sub-recess 430. For example, the first sub-recess 430 may be formed by a RIE process or a dry etching process.

A second sub-recess 455 is formed under the first sub-recess 430. The second sub-recess 455 isotropically expands in a horizontal direction away from the first central axis I of the first sub-recess 430. A width of the second sub-recess 455 may be substantially larger than the width of the first sub-recess 430. For example, a cross section of the second sub-recess 455 may generally have an oval shape or a track-shape. The second sub-recess 455 has a second central axis II that is substantially perpendicular to the upper face of the substrate 400. The second central axis II may be spaced apart horizontally from the first central axis I by a predetermined interval. A second central point C2 of the second sub-recess 455 may be spaced apart from the first central point C1 of the first sub-recess 430 by a predetermined distance. The second central axis II on which the second central point C2 lies is substantially in parallel with the first central axis I. The semiconductor substrate 400 may be isotropically etched to form the second sub-recess 455. For example, the second sub-recess 455 may be formed by a dry etching process and/or a wet etching process. The asymmetric recess 460 that includes the first and second sub-recesses 430 and 455 may have a substantial sock shape or a substantial boot shape.

The gate insulation layer 470 is formed on the active region of the semiconductor substrate 400 and inner faces of the first and second sub-recesses 430 and 455. In certain embodiments, the gate insulation layer 470 may be formed using silicon oxide or metal oxide.

The gate electrode 480 is formed on the gate insulation layer 470. The gate electrode may fill the remainder of the asymmetric recess 460. As shown in FIG. 8, a lower portion of the gate electrode 480 may fill the asymmetric recess 460, and an upper portion of the gate electrode 480 may protrude upwardly from the upper face of the semiconductor substrate 400. The gate electrode 480 may include a first conductive film pattern 480a and a second conductive film pattern 480b. The first conductive film pattern 480a may comprise, for example, polysilicon doped with impurities. The second conductive film pattern 480b may comprise, for example, a metal silicide or metal. The gate mask 490 is formed on the gate electrode 480. The gate mask 490 may have an etching selectivity with respect to the gate electrode 480. In certain embodiments, the gate mask 490 may include a nitride.

Processes for the asymmetric recess 460 in FIG. 8 are substantially the same as those already illustrated in FIGS. 6A to 6E or in FIGS. 7A to 7C. Thus, any further explanations will be omitted.

The gate insulation layer 470 is formed on the semiconductor substrate 400 and the inner face of the asymmetric recess 460. More particularly, the gate insulation layer 470 may be formed on the active region of the semiconductor substrate 400 and on inner faces of the first and second sub-recesses 430 and 455. In some embodiments, the gate insulation layer 470 may be formed using metal oxide having a substantially high dielectric constant. In other embodiments, the gate insulation layer 470 may be formed using an oxide such as silicon oxide. The gate insulation layer 470 may be formed by a thermal oxidation process, a CVD process or an ALD process.

A first conductive film (not shown) is formed on the gate insulation layer 470 to fill the asymmetric recess 460 that is partially filled with the gate insulation layer 470. The first conductive film may be formed, for example, using conductive material such as metal, polysilicon doped with impurities or a conductive metal nitride. The first conductive film may be formed, for example, by a CVD process, an ALD process, a sputtering process or a pulse laser deposition process.

A second conductive film (not shown) is formed on the first conductive film. The second conductive film may be formed, for example, using metal silicide or metal. For example, the second conductive film may comprise a tungsten silicide, cobalt silicide, titanium silicide, tungsten, titanium or aluminum film. In other embodiments, the second conductive film may include at least two thin films such as, for example, a metal silicide thin film and/or a metal thin film.

The gate mask 490 is formed on the second conductive film. The second conductive film and the first conductive film are anisotropically etched using the gate mask 490 as an etching mask to form the gate electrode 480 including the first and second conductive film patterns 480a and 480b. Thus, the asymmetric gate structure 495 including the gate insulation layer 470, the gate electrode 480 and the gate mask 490 may be manufactured. The gate mask 490 has an etching selectivity with respect to the first and second conductive film patterns 480a and 480b. For example, the gate mask 490 is formed using silicon nitride or silicon oxynitride. The gate mask 490 may be formed by a CVD process or an ALD process.

Figure 9:
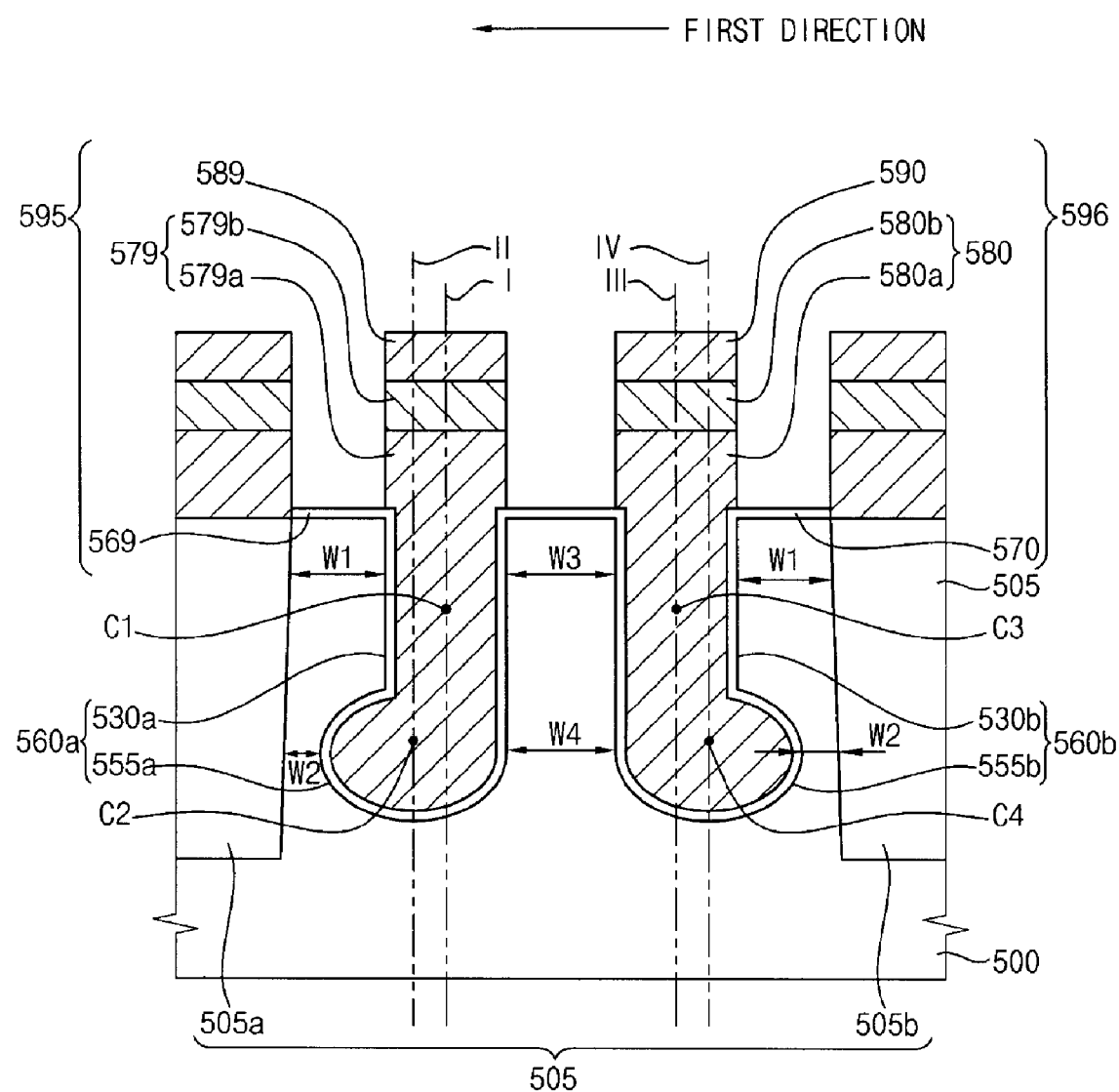
FIG. 9 is a cross-sectional diagram illustrating a semiconductor device having an asymmetric recessed gate structure in accordance with embodiments of the present invention.

FIG. 9 is a cross-sectional diagram illustrating a semiconductor device having an asymmetric recessed gate structure in accordance with some embodiments of the present invention.

Referring to FIG. 9, a semiconductor device includes first and second asymmetric recessed gate structures 595 and 596.

The first asymmetric recessed gate structure 595 includes a first gate insulation layer 569, a first gate electrode 579 and a first gate mask 589. The first insulation layer 569 is formed on an inner face of a first asymmetric recess 560a and a semiconductor substrate 500. The first gate electrode 579 is formed on the first gate insulation layer 569 to fill the first asymmetric recess 560a that is partially filled with the first gate insulation layer 569. The first gate mask 589 is formed on the first gate electrode 579.

The second asymmetric recessed gate structure 596 includes a second gate insulation layer 570, a second gate electrode 580 and a second gate mask 590. The second gate insulation layer 570 is formed on an inner face of a second asymmetric recess 560b and the semiconductor substrate 500. The second gate electrode 580 is formed on the second gate insulation layer 570 to fill the second asymmetric recess 560b that is partially filled with the second gate insulation layer 570. The second gate mask 590 is formed on the second gate electrode 580.

The semiconductor substrate 500 may comprise, for example, a silicon wafer or an SOI substrate. An isolation layer 505 is formed at an upper portion of the semiconductor substrate 500 so that the semiconductor substrate 500 may be divided into a field region and an active region. The isolation layer 505 may be formed by an isolation process such as an STI process. Although it is not particularly illustrated in FIG. 9, a sidewall of the isolation layer 505 may form an interior angle of about 70° to about 90° with an upper face of the semiconductor substrate 500.

The first and second asymmetric recesses 560a and 560b are formed at the active region. The first asymmetric recess 560a includes first and second sub-recesses 530a and 555a. The second asymmetric recess 560b includes third and fourth sub-recesses 530b and 555b.

The isolation layer 505 includes first and second portions 505a and 505b that are located on opposite sides of the active region. The first asymmetric recess 560a is adjacent to the first portion 505a of the isolation layer 505. In particular, the first sub-recess 530a is spaced apart from the first portion 505a of the isolation layer 505 by a first interval W1. The first sub-recess 530a has a first central axis I on which a first central point C1 of the first sub-recess 530a lies. The first central axis I may be substantially perpendicular to the upper face of the semiconductor substrate 500. The second sub-recess 555a is spaced apart from the first portion 505a of the isolation layer 505 by a second interval W2. Because the second sub-recess 555a is horizontally expanding toward the first portion 505a of the isolation layer 505, the second interval W2 is substantially smaller than the first interval W1. The second sub-recess 555a has a second central axis II on which a second central point C2 of the second sub-recess 555a lies. The second central axis II is substantially perpendicular to the upper face of the semiconductor substrate 500. The second central axis II is substantially in parallel with the first central axis I. In addition, the second sub-recess 555a is spaced apart horizontally from the first central axis I by a predetermined interval, as illustrated.

The second asymmetric recess 560b is adjacent to the second portion 505b of the isolation layer 505. Particularly, the third sub-recess 530b is horizontally apart from the second portion 505b of the isolation layer 505 by the first interval W1. The third sub-recess 530b has a third central axis III on which a third central point C3 of the third sub-recess 530b lies. The third central axis III is substantially perpendicular to the upper face of the semiconductor substrate 500. The fourth sub-recess 555b is spaced apart horizontally from the second portion 505b of the isolation layer 505 by the second interval W2. The fourth sub-recess 555b is horizontally expanding toward the second portion 505b of the isolation layer 505. As described above, the second interval W2 is substantially smaller than the first interval W1. The fourth sub-recess 555b has a fourth central axis IV on which a fourth central point C4 lies. The fourth central axis IV is substantially perpendicular to the upper face of the semiconductor substrate 500. The third central axis III is spaced apart horizontally from the fourth central axis IV by a predetermined interval, as illustrated. In addition, the third central axis III may be substantially in parallel with the fourth central axis IV.

The first sub-recess 530a is spaced apart horizontally from the third sub-recess 530b by a third interval W3. The second sub-recess 555a is spaced apart horizontally from the fourth sub-recess 555b by a fourth interval W4. The third interval W3 may be substantially the same as the fourth interval W4. The second and fourth sub-recesses 555a and 555b horizontally expand in opposite directions. That is, the second and fourth sub-recesses 555a and 555b expand toward the first and second portions 505a and 505b, respectively, of the isolation layer 505.

A first gate insulation layer 569 is formed on the semiconductor substrate 500 and an inner face of the first asymmetric recess 560a. A second gate insulation layer 570 is formed on the semiconductor substrate 500 and an inner face of the second asymmetric recess 560b. The first gate insulation layer 569 may be integrally formed with the second gate insulation layer 570.

A first gate electrode 579 fills the first asymmetric recess 560a. In addition, the first gate electrode 579 partially protrudes from the upper face of the semiconductor substrate 500. The first gate electrode 579 includes first and second conductive film patterns 579a and 579b. The first conductive film pattern 579a fills the first asymmetric recess 560a, and partially protrudes from the upper face of the semiconductor substrate 500. The second conductive film pattern 579b is formed on the first conductive film pattern 579a. A first gate mask 589 is formed on the second conductive film pattern 579b.

A second gate electrode 580 fills the second asymmetric recess 560b and partially protrudes from the upper face of the semiconductor substrate 500. The second gate electrode 580 includes third and fourth conductive film patterns 580a and 580b. The third conductive film pattern 580a fills the second asymmetric recess 560b and partially protrudes from the upper face of the semiconductor substrate 500. The fourth conductive film pattern 580b is formed on the third conductive film pattern 580a. A second gate mask 590 is formed on the fourth conductive film pattern 580b.

Because the second and fourth sub-recesses 555a and 555b expand in opposite directions, a lower portion of the first gate electrode 579 and a lower portion of the second gate electrode 580 may also expand in the opposite directions.

In addition, a semiconductor device including the asymmetric recessed gate structure has first and second source/drain regions (not shown) having first and second junctions, respectively. The first source/drain region is formed at a portion of the semiconductor substrate 500, the portion being located between the first asymmetric recessed gate structure 595 and the first portion 505a of the isolation layer 505. The second source/drain region is formed at a portion of the semiconductor substrate 500, the portion being located between the second asymmetric recessed gate structure 596 and the second portion of the isolation layer 505.

An upper portion of the first gate electrode 579 is spaced apart horizontally from the first portion 505a of the isolation layer 505 by the first interval W1. A lower portion of the first gate electrode 570 is spaced apart horizontally from the first portion 505a of the isolation layer 505 by the second interval W2 that is substantially smaller than the first interval W1. The first junction of the first source/drain region may be formed between the second sub-recess 555a and the first portion 505a of the isolation layer 505. For example, the first junction may have a relatively short width that is substantially the same as the second interval W2. Thus, a leakage current through the first junction may be reduced. In addition, an upper portion of the second gate electrode 580 is spaced apart horizontally from the second portion 505b of the isolation layer 505 by the first interval W1. A lower portion of the second gate electrode 580 is spaced apart horizontally from the second portion 505b of the isolation layer 505 by the second interval W2. The second junction of the second source/drain region is formed between the fourth sub-recess 555b and the second portion 505b of the isolation layer 505. For example, the second junction has a relatively short width that is substantially the same as the second interval W2. Thus, a leakage current through the second junction may be reduced. Thus, electric characteristics of the semiconductor device including the first and second asymmetric recessed gate structures 595 and 596 may be improved.

The upper portion of the first gate electrode 579 is spaced apart horizontally from the upper portion of the second gate electrode 580 by the third interval W3. The lower portion of the first gate electrode 579 is spaced apart horizontally from the lower portion of the second gate electrode 580 by the third interval W4 that may be substantially the same as the third interval W3. Because the first gate electrode 579 is adequately spaced apart from the second gate electrode 580, an electric noise generated when the first and second gate electrodes 579 and 580 approach each other may be prevented. In addition, if an interval between the first and second asymmetric gate structures 595 and 596 increases, widths of the first and second junctions may decrease. Thus, a deterioration of electric characteristics of the semiconductor device, the deterioration being generated when a design rule of the semiconductor device is reduced below, for example, about 70 nm, may be reduced and/or prevented by adjusting the interval between the first and second asymmetric gate structures 595 and 596.

FIGS. 10A-10D are cross-sectional diagrams illustrating a method of manufacturing an asymmetric recessed gate structure in accordance with some embodiment of the present invention.

Figure 10A:
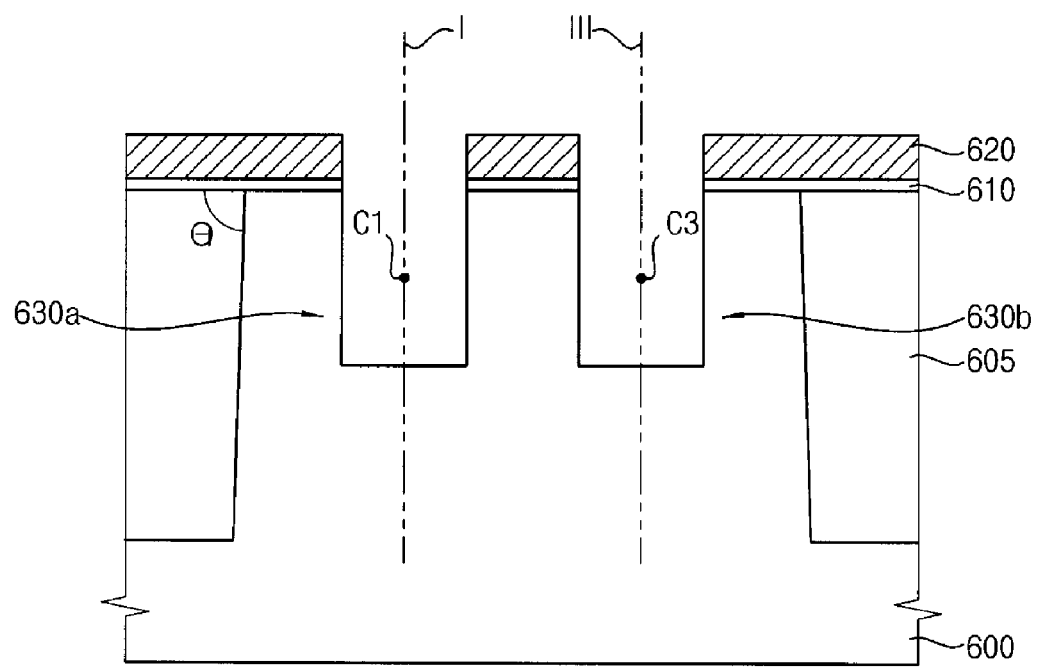
FIGS. 10A to 10D are cross-sectional diagrams illustrating a method of manufacturing an asymmetric recessed gate structure in accordance with embodiments of the present invention.

Referring to FIG. 10A, an isolation layer 605 is formed at a semiconductor substrate 600 so that the semiconductor substrate 600 may be divided into a field region and an active region. The isolation layer 605 may be formed by an isolation process such as, for example, an STI process. In addition, a sidewall of the isolation layer 605 may form an interior angle ($\theta_I$) with an upper face of the semiconductor substrate 600.

A buffer oxide layer (not shown) and a hard mask pattern 620 are subsequently formed on the semiconductor substrate 600 at which the isolation layer 605 is formed. Next, the buffer oxide layer and the semiconductor substrate 600 are anisotropically etched using the hard mask pattern 620 as an etching mask. Thus, a buffer oxide layer pattern 610 is formed under the hard mask pattern 620. At the same time, first and third sub-recesses 630a and 630b are formed at an upper portion of the semiconductor substrate 600. The first and third sub-recesses 630a and 630b have first and third central axes I and III, respectively. The first and third central axes I and III are substantially perpendicular to the upper face of the semiconductor substrate 600. A first central point C1 of the first sub-recess 630a lies on the first central axis I. A third central point C3 of the third sub-recess 630b lies on the third central axis III.

Figure 10B:
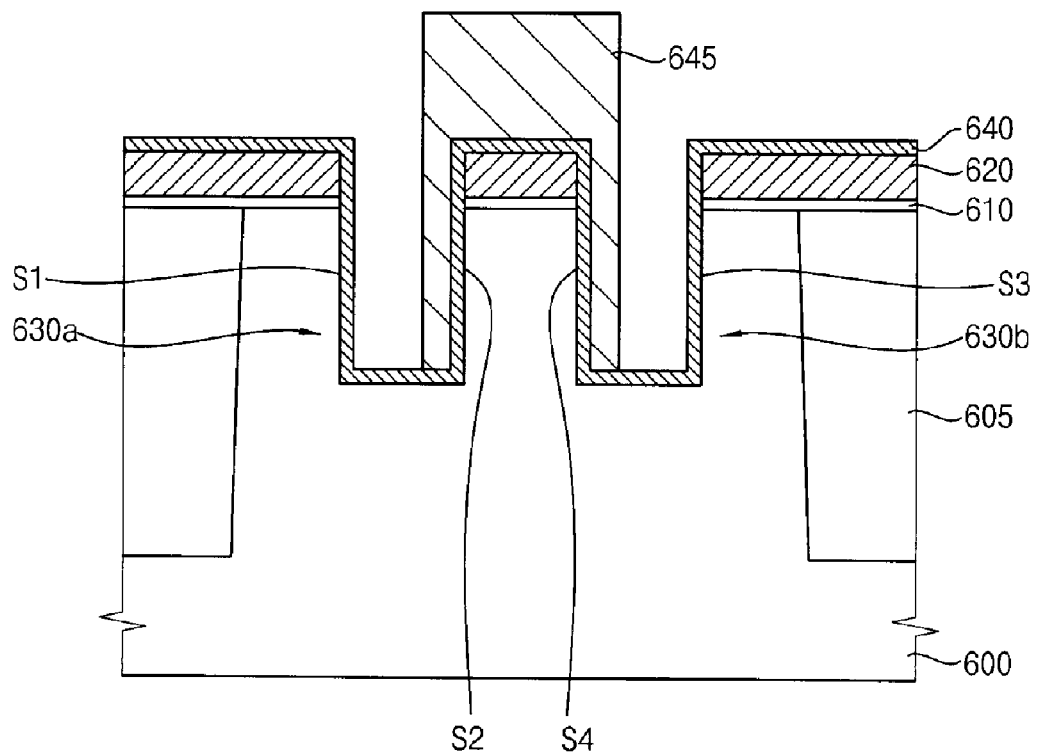

Referring to FIG. 10B, a first mask layer 640 is continuously formed on the hard mask pattern 620 and inner faces of the first and third sub-recesses 630a and 630b. The first mask layer 640 has an etching selectivity with the semiconductor substrate 600. The first mask layer 640 may include first material. As one example, the first material is an oxide such as silicon oxide. As another example, the first material is a nitride such as silicon nitride and/or titanium nitride. The first material may be a middle temperature oxide (MTO).

An auxiliary mask layer (not shown) is formed on the first mask layer 640 to fill the first and third sub-recesses 630a and 630b that are partially filled with the first mask layer 640. The auxiliary mask layer has an etching selectivity with the first mask layer 640. For example, the auxiliary mask layer may comprise a second material. The second material may be, for example, photoresist, silicon oxide, silicon nitride, metal or metal nitride. The second material may be substantially different from the first material included in the first mask layer 640.

The auxiliary mask layer is partially etched to form an auxiliary mask pattern 645 that covers side faces of the first and third sub-recesses 630a and 630b. The auxiliary mask pattern 645 may be utilized to form second and fourth sub-recesses 655a and 655b under the first and third sub-recesses 630a and 630b (See FIG. 10D), respectively. In particular, the first sub-recess 630a includes a first side face S1 adjacent to the isolation layer 605 and a second side face S2 facing the first side face S1. The third sub-recess 630b includes a third side face S3 adjacent to the isolation layer 605 and a fourth side face S4 facing the third side face S3. The auxiliary mask pattern 645 may not cover the first and third side faces S1 and S3. The auxiliary mask pattern 645 may cover the second and fourth side faces S2 and S4 and portions of bottom faces of the first and third sub-recesses 630a and 630b. That is, a cross section of the auxiliary mask pattern 645 may have an inverted U-shape. Because a width of the auxiliary mask pattern 645 is substantially larger than respective widths of the first and third sub-recesses 630a and 630b, it may be possible to form the auxiliary mask pattern 645 even though the widths of the first and third sub-recesses 630a and 630b are relatively small. That is, if the first and third sub-recesses 630a and 630b are partially filled with two substitutes instead of the auxiliary mask pattern 645 that partially fills both the first and third sub-recesses 630a and 630b, it may be difficult to form the substitute. This is because a width of the substitute is substantially smaller than that of the auxiliary mask pattern 645.

Figure 10C:
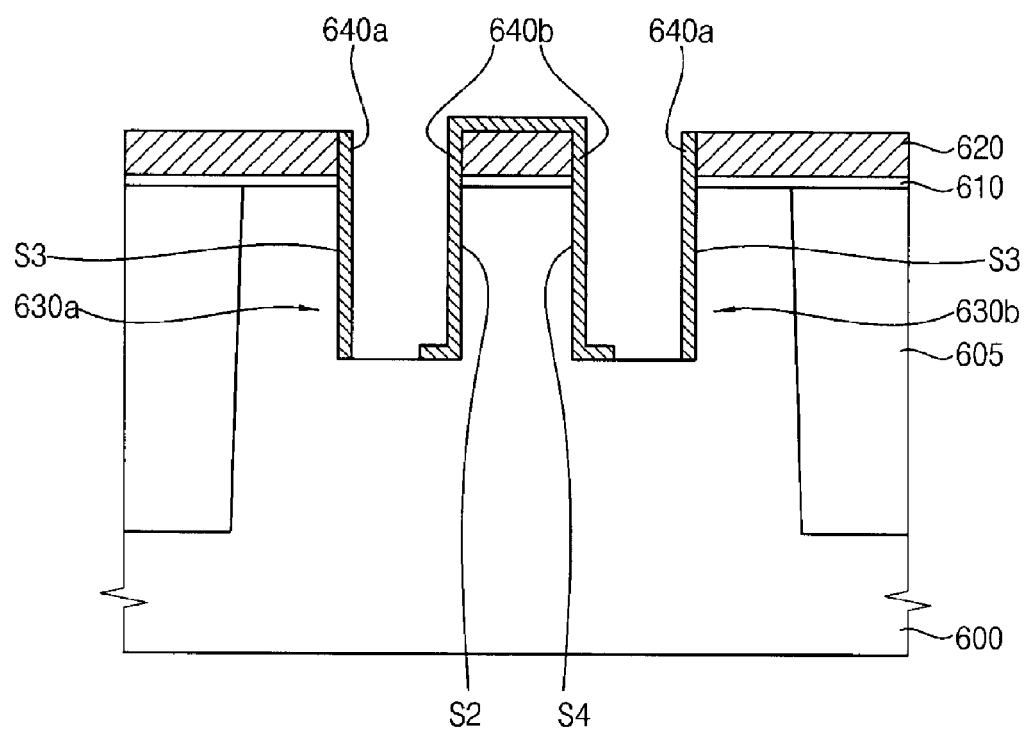

Referring to FIG. 10C, the first mask layer 640 is anisotropically etched using the auxiliary mask pattern 645 as an etching mask to form the first and second mask patterns 640a and 640b. The first mask patterns 640a are formed on the first and third side faces S1 and S3. The first mask patterns 640a have a first length. The second mask patterns 640b cover the second and fourth side faces S2 and S4 and the portions of the bottom faces of the first and second sub-recesses 630a and 630b. Thus, the second mask patterns 640b have a second length that is substantially larger than the first length. The second mask patterns 640b may be integrally formed as one body. The bottom faces of the first and third sub-recesses 630a and 630b are partially exposed between the first and second mask patterns 640a and 640b.

In embodiments where the auxiliary mask pattern 645 includes photoresist, the auxiliary mask pattern 645 may be removed, for example, by an ashing process and/or a stripping process.

Figure 10D:
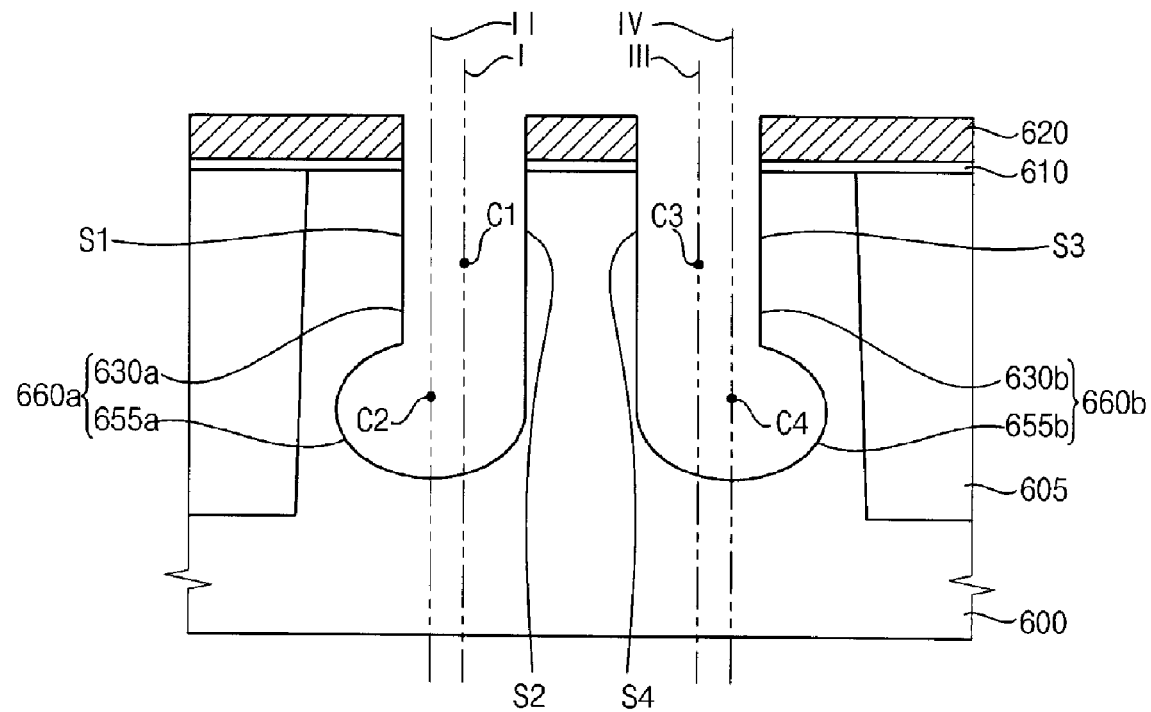

Referring to FIG. 10D, an isotropic etching process is performed on the portions of the semiconductor substrate 600 exposed between the first and second mask patterns 640a and 640b using the first and second mask patterns 640a and 640b as an etching mask. Thus, preliminary second and fourth sub-recesses (not shown) are formed under the first and third sub-recesses 630a and 630b, respectively. The shapes of the first and second masks 640a and 640b may geometrically determine the shapes of the preliminary second and fourth sub-recesses. Thus, the preliminary second and fourth sub-recesses may have second and fourth central axes II and IV, respectively, that are spaced apart horizontally from the first and second central axes I and II, respectively, by predetermined intervals. A second central point C2 of the preliminary second sub-recess and a fourth central point C4 of the preliminary fourth sub-recess lie on the second central axis II and the fourth central axis IV, respectively. The second and fourth central axes II and IV are substantially in parallel with the first and third central axes I and III, respectively.

As described above, the preliminary second and fourth sub-recesses are formed by the isotropic etching process. Thus, widths of the preliminary second and fourth sub-recesses may be substantially larger than those of the first and third sub-recesses 630a and 630b. In addition, the preliminary second and fourth sub-recesses may have rounded cross sections. For example, the preliminary second and fourth sub-recesses may be formed by an isotropic dry etching process that uses an etching gas including a sulfur hexafluoride gas, a chlorine gas and an oxygen gas. The isotropic etching process may be performed, for example, for about 5 seconds to about 40 seconds. In certain embodiments, the isotropic etching process is performed for about 10 seconds to about 20 seconds.

The first and second mask patterns 640a and 640b are removed from the semiconductor substrate 600 by a wet etching process. If the first and second mask patterns 640a and 640b include oxide, the wet etching process may, for example, use an etching solution including ammonium hydroxide ($NH_4OH$), hydrogen peroxide ($H_2O_2$) and pure water ($H_2O$). The preliminary second and preliminary fourth sub-recesses 655a and 655b may further expand in the wet etching process so that second and fourth sub-recesses 655a and 655b expanding in substantially opposite directions toward the isolation layer 605 may be formed. In this case, byproducts remaining on inner faces of the second and fourth sub-recesses 655a and 655b may be removed in the wet etching process.

The second and fourth sub-recesses 655a and 655b are formed under the first and third sub-recesses 630a and 630b, respectively. Thus, a first asymmetric recess 660a including the first and second sub-recesses 630a and 655a and a second asymmetric recess 660b including the third and fourth sub-recesses 630b and 655b are formed.

Referring again to FIG. 9, the buffer oxide layer pattern 610 and the hard mask pattern 620 are removed. First and second gate insulation layers 569 and 570 are then formed on inner faces of the first and second asymmetric recesses 560a and 560b, respectively. The buffer oxide layer pattern 610 and the hard mask pattern 620 may, for example, be removed by a wet etching process using a diluted hydrogen fluoride solution and/or an etching solution including phosphoric acid ($H_3PO_4$).

A first conductive film (not shown) is formed on the first and second gate insulation layers 569 and 570 to fill the first and second asymmetric recesses 560a and 560b that are partially filled with the first and second gate insulation layers 569 and 570, respectively. A second conductive film (not shown) is formed on the first conductive film. First and second gate masks 589 and 590 are then formed on the second conductive film. The first and second conductive films are anisotropically etched using the first and second gate masks 589 and 590 together as an etching mask so that first and second gate electrodes 579 and 580 may be formed. The first gate electrode 579 includes a first conductive film pattern 579a and a second conductive film pattern 579b. The second gate electrode 580 includes a third conductive film pattern 580a and a fourth conductive film pattern 580b. Thus, first and second asymmetric recessed gate structures 595 and 596 may be formed.

A first source/drain region is formed at the portion of the semiconductor substrate 500 exposed between the first gate electrode 579 and the isolation layer 505. At the same time, a second source/drain region is formed at the portion of the semiconductor substrate 500 exposed between the second gate electrode 580 and the isolation layer 505. Thus, a semiconductor device including the first and second asymmetric recessed gate structures 595 and 596 may be manufactured.

Figure 11A:
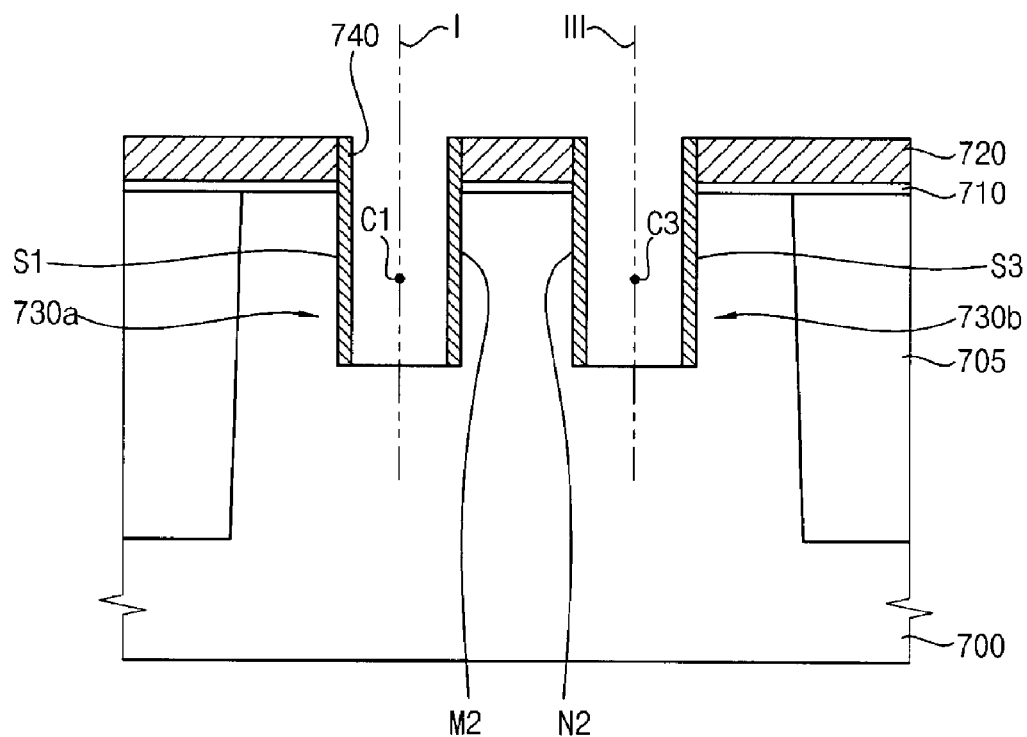
FIGS. 11A to 11C are cross-sectional diagrams illustrating methods of manufacturing a semiconductor device having an asymmetric recessed gate structure in accordance with embodiments of the present invention.
Figure 11B:
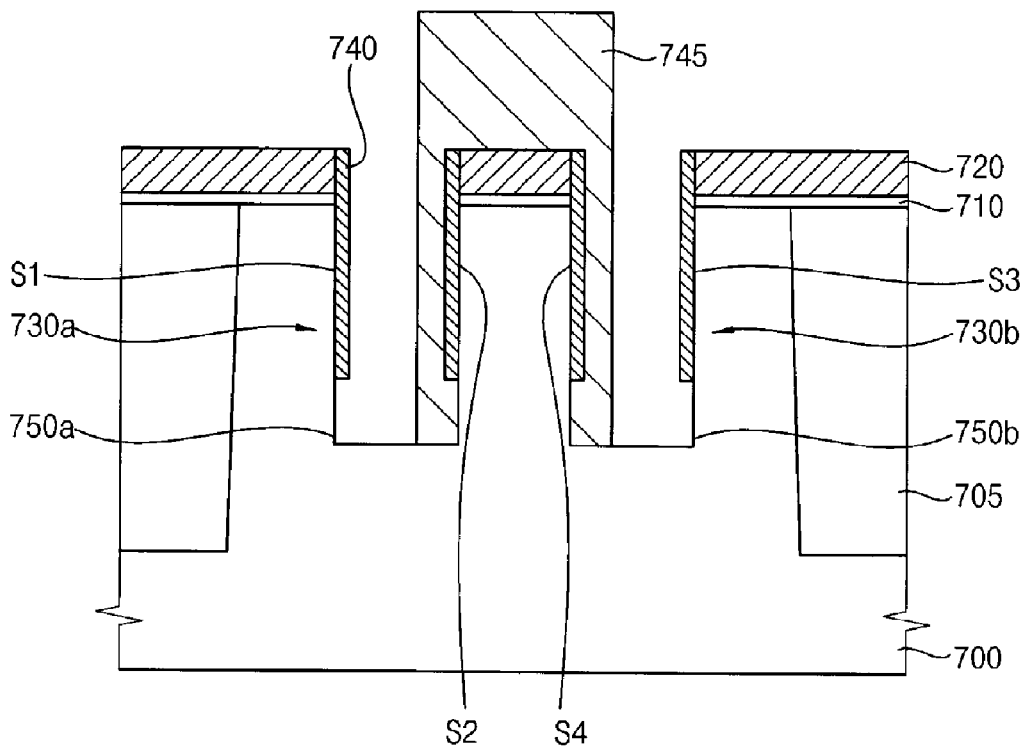
Figure 11C:
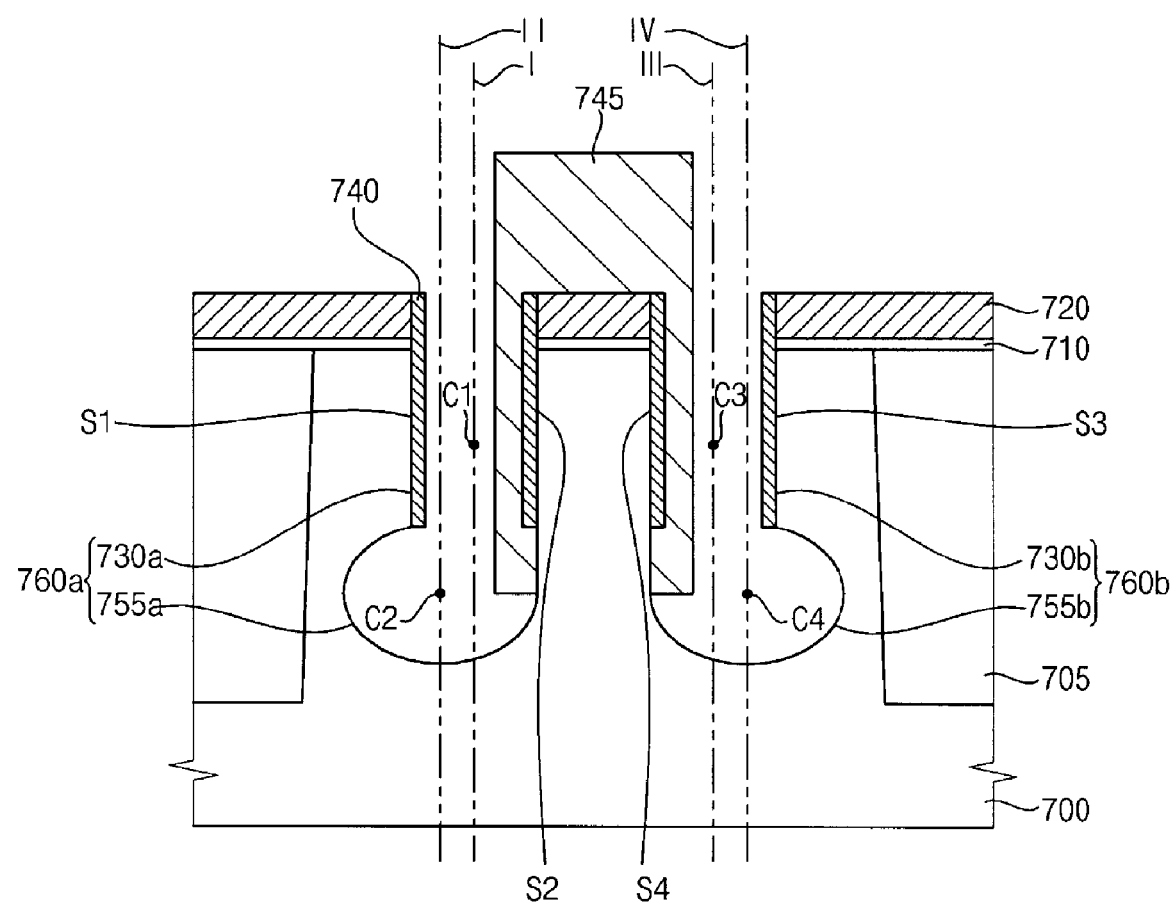

FIGS. 11A to 11C are cross-sectional diagrams illustrating a method of manufacturing a semiconductor device having an asymmetric recessed gate structure in accordance with some embodiments of the present invention.

Referring to FIG. 11A, a buffer oxide layer (not shown) and a hard mask pattern 720 are formed on a semiconductor substrate 700 at which an isolation layer 705 is formed. The buffer oxide layer and the semiconductor substrate 700 are etched using the hard mask pattern 720 as an etching mask to form a buffer oxide layer pattern 710, a first sub-recess 730a and a third sub-recess 730b. The first and third sub-recesses 730a and 730b have first and third central axes I and II, respectively. A first central point C1 of the first sub-recess 730a lies on the first central axis I. A third central point C3 of the third sub-recess 730b lies on the third central axis III.

A first mask layer (not shown) is formed on the semiconductor substrate 700 and inner faces of the first and third sub-recesses 730a and 730b. Next, the first mask layer is anisotropically etched so that first mask patterns 740 may be formed on side faces of the first and third sub-recesses 730a and 730b. The first mask pattern 740 has a first length.

Preliminary second and fourth sub-recesses 750a and 750b are formed under the first and third sub-recesses 730a and 730b, respectively, by, for example, an anisotropic etching process using the first mask patterns 740 together as an etching mask. Here, the preliminary second sub-recess 750a and the first sub-recess 730a have substantially the same central axes. In addition, the preliminary fourth sub-recess 750b and the third sub-recess 730b have substantially the same central axes.

Referring to FIG. 11B, a second mask pattern 745 is formed. The second mask pattern 745 may enable the preliminary second and fourth sub-recesses 750a and 750b to be changed into second and fourth sub-recesses 755a and 755b, respectively, that have second and fourth central axes II and IV, respectively. A second central point C2 of the second sub-recess 755a lies on the second central axis II. A fourth central point C4 of the fourth sub-recess 755b lies on the fourth central axis IV. In addition, the first and third central axes I and III are spaced apart horizontally from the second and fourth central axes II and IV, respectively. The second mask pattern 745 may be a photoresist pattern.

The second mask pattern 745 may not cover first and third side faces S1 and S3 adjacent to the isolation layer 705. On the other hand, the second mask pattern 745 may cover second and fourth side faces S2 and S4 facing the first and third side faces S1 and S3, respectively. A cross section of the second mask pattern 745 may have an inverted U-shape. After the second mask pattern 745 is formed, first mask patterns 740 having the first lengths may remain on the first and third side faces S1 and S3. In addition, the second mask pattern 745 may fully cover the second and fourth side faces S2 and S4. The second mask pattern 745 may have a second length that is substantially larger than the first length.

That is, the first mask pattern 740 may not extend to bottom faces of the preliminary second and fourth sub-recesses 750a and 750b. On the other hand, the second mask pattern 745 may extend to the bottom faces of the preliminary second and fourth sub-recesses 750a and 750b. Thus, the first side face S1 and the bottom face of the preliminary second sub-recess 750a may be partially exposed between the first and second mask patterns 740 and 745. In addition, the third side face S3 and the bottom face of the preliminary fourth sub-recess 750b may be exposed between the first and second mask patterns 740 and 745.

Referring to FIG. 11C, the preliminary second and fourth sub-recesses 750a and 750b are expanded by an isotropic etching process using the first and second mask patterns 740 and 745 together as an etching mask to form the second and fourth sub-recesses 755a and 755b. The shapes of the first and second mask patterns 740 and 745 may geometrically determine shapes of the second and fourth sub-recesses 755a and 755b. Thus, the second and fourth sub-recesses 755a and 755b may horizontally expand in opposite directions toward the isolation layer 705.

Thus, a first asymmetric recess 760a including the first and second sub-recesses 730a and 755a and a second asymmetric recess 760b including the third and fourth sub-recesses 730b and 755b may be formed.

Referring again to FIG. 9, the buffer oxide layer pattern 710 and the hard mask pattern 720 are removed. First and second gate insulation layers 569 and 570 are formed on the semiconductor substrate 500 and inner faces of the first and second asymmetric recesses 560a and 560b.

A first conductive film (not shown) is formed on the first and second gate insulation layers 569 and 570 to fill the first and second asymmetric recesses 560a and 560b that are partially filled with the first and second gate insulation layers 569 and 570, respectively. A second conductive film (not shown) is formed on the first conductive film. First and second gate masks 589 and 590 are then formed on the second conductive film. The first and second conductive films are anisotropically etched using the first and second gate masks 589 and 590 together as an etching mask so that first and second gate electrodes 579 and 580 may be formed. The first gate electrode 579 includes a first conductive film pattern 579a and a second conductive film pattern 579b. The second gate electrode 580 includes a third conductive film pattern 580a and a fourth conductive film pattern 580b. Thus, first and second asymmetric recessed gate structures 595 and 596 may be formed.

A first source/drain region is formed at a portion of the semiconductor substrate 500, the portion being located between the first gate electrode 579 and the isolation layer 505. At the same time, a second source/drain region is formed at a portion of the semiconductor substrate 500, the portion being located between the second gate electrode 580 and the isolation layer 505. Thus, a semiconductor device including the first and second asymmetric recessed gate structures 595 and 596 may be manufactured.

According to embodiments of the present invention, a lower portion of an asymmetric gate structure has an extended cross section having a substantial circle shape, a substantial oval shape or a substantial track shape. Thus, a length of a channel formed around the lower portion of the asymmetric gate structure may be extended.

In addition, because the lower portion of the asymmetric gate structure is extended toward an isolation layer, a width of a junction formed between the isolation layer and the lower portion of the asymmetric gate structure may decrease. This may facilitate reducing leakage current through the junction.

Furthermore, an interval between the asymmetric gate structures may be kept substantially constant. Thus, noise that may be generated between the asymmetric gate structures may decrease. As a result, a semiconductor device including the asymmetric gate structure may have improved characteristics such as a reduced leakage current or an extended retention time.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a recess, the method comprising:
   etching a semiconductor substrate to form a first sub-recess having a first central axis, wherein the first sub-recess has a first side face and a second side face facing the first side face;

forming first and second mask patterns on the first and second side faces, respectively, wherein the first and second mask patterns have first and second lengths, respectively, and wherein the second length is substantially larger than the first length; and forming a second sub-recess under the first sub-recess, wherein the second sub-recess is in communication with the first sub-recess, wherein the second sub-recess has a second central axis that is substantially parallel with the first central axis, and wherein the second central axis is spaced apart from the first central axis.

2. The method of claim 1, wherein the first and second sub-recesses are formed by an anisotropic etching process and an isotropic etching process, respectively.

3. The method of claim 1, wherein the second sub-recess expands in a direction away from the first central axis, wherein the direction is substantially perpendicular to the first central axis.

4. The method of claim 1, wherein the second sub-recess is extended under the first mask pattern.

5. The method of claim 1, wherein the first and second mask patterns include substantially the same material.

6. The method of claim 5, wherein the first and second mask patterns include material selected from the group consisting of silicon oxide, silicon nitride and metal nitride.

7. The method of claim 1, wherein forming the first and second mask patterns comprising:
   forming a mask layer on the first side face, the second side face and a bottom face of the first sub-recess, the mask layer having a first side portion, a second side portion and a bottom portion that are located on the first side face, the second side face and the bottom face, respectively, of the sub-recess;
   forming an auxiliary mask pattern on the second side portion of the mask layer to partially cover the bottom portion of the mask layer; and
   performing an anisotropic etching process on the mask layer by using the auxiliary mask pattern as an etching mask to form the first and second mask patterns, the first mask pattern corresponding to the first side portion of the mask layer, the second mask pattern corresponding a portion of the mask layer, the portion being located between the auxiliary mask pattern and the semiconductor substrate.

8. The method of claim 1, wherein the mask layer and the auxiliary mask pattern include substantially different materials.

9. The method of claim 8, wherein the mask layer includes material selected from the group consisting of silicon oxide, silicon nitride, photoresist, metal oxide and metal nitride, and the auxiliary mask pattern includes material selected from the group consisting of silicon oxide, silicon nitride, photoresist, metal oxide and metal nitride.

10. The method of claim 1, wherein forming the first and second mask patterns comprises:
   forming a first mask layer on the first side face, the second side face and a bottom face of the first sub-recess;
   etching the first mask layer to form the first mask patterns on the first and second side faces of the first sub-recesses;
   etching a portion of the semiconductor substrate, the portion being exposed between the first mask patterns, to form a preliminary second sub-recess; and
   forming the second mask pattern on the second side face on which the first mask pattern is formed.

11. A method of forming an asymmetric recess, the method comprising:

forming an isolation layer at a semiconductor substrate to define an active region and a field region, the isolation layer including first and second portions that are located on opposite sides of the active region;

etching the semiconductor substrate to form first and second sub-recesses having first and second central axes, respectively, the first central axis being substantially parallel with the second central axis, the first and second sub-recesses being formed at the active region, the first sub-recess having first and second side faces, the first side face being adjacent to the first portion of the isolation layer, the second side face facing the first side face, the second sub-recess having third and fourth side faces. the third side face being adjacent to the second portion of the isolation layer. the third side face facing the fourth side face;

forming first and second mask patterns, the first mask patterns being located on the first and third side faces, the second mask patterns being located on the second and fourth side faces, the first and second mask patterns having first and second lengths, respectively, the second length being substantially larger than the first length; and forming third and fourth sub-recesses under the first and second sub-recesses, respectively, the third and fourth sub-recesses being in communication with the first and second sub-recesses, respectively, the third and fourth sub-recesses having third and fourth central axes, respectively, the third and fourth central axes being substantially parallel with the first and second central axes, respectively, the third and fourth sub-recesses extending in substantially opposite directions away the first and second central axes, respectively, the opposite directions being substantially perpendicular to the first and second central axes.

12. The method of claim 11, wherein the second mask patterns are formed as one body.

13. A method of manufacturing a semiconductor device, the method comprising:

forming an isolation layer on a semiconductor substrate to define an active region and a field region, the isolation layer including first and second portions being located on opposite sides of the active region;

etching the semiconductor substrate to form first and second sub-recesses having first and second central axes, respectively, the first central axis being substantially parallel with the second central axis, the first central axis being spaced apart from the second central axis, the first and second sub-recesses being formed at the active region, the first sub-recess having first and second side faces, the first side face adjacent to the first portion of the isolation layer, the second side face facing the first side face, the second sub-recess having third and fourth side faces, the third side face being adjacent to the second portion of the isolation layer, the third side face facing the fourth side face;

forming first and second mask patterns, the first mask patterns being located on the first and third side faces, the second mask patterns being located on the second and fourth side faces, the first and second mask patterns having first and second lengths, respectively, the second length being substantially larger than the first length;

forming third and fourth sub-recesses under the first and second sub-recesses, respectively, the third and fourth sub-recesses being in communication with the first and second sub-recesses, respectively, the third and fourth sub-recesses having third and fourth central axes, respectively, the third and fourth central axes being substantially parallel with the first and second central axes, respectively, the third and fourth central axes being spaced apart from the first and second central axes, respectively, the third and fourth sub-recesses being extended in substantially opposite directions from the first and second central axes, the opposite directions being substantially perpendicular to the first and second central axes;

forming a first gate insulation layer on the semiconductor substrate and inner faces of the first and third sub-recesses;

forming a second gate insulation layer on the semiconductor substrate and inner faces of the second and fourth sub-recesses;

forming a first gate electrode on the first gate insulation layer to fill up the first and third sub-recesses that are partially filled with the first gate insulation layer; and forming a second gate electrode on the second gate insulation layer to fill up the second and fourth sub-recesses that are partially filled with the second gate insulation layer.

14. The method of claim 13, further comprising extending the third and fourth sub-recesses as well as removing the first and second mask patterns by using a wet etching process before the first and second gate insulation layers are formed.

15. The method of claim 14, wherein the wet etching process uses an etching solution including ammonium hydroxide, hydrogen peroxide and pure water.

* * * * *